United States Patent [19]
Norman

[11] Patent Number: 5,873,112
[45] Date of Patent: Feb. 16, 1999

[54] SYSTEM AND METHOD FOR ENCODING DATA TO REDUCE POWER AND TIME REQUIRED TO WRITE THE ENCODED DATA TO A FLASH MEMORY

[75] Inventor: Robert D. Norman, San Jose, Calif.

[73] Assignee: Micron Technology, Inc., Santa Clara, Calif.

[21] Appl. No.: 730,181

[22] Filed: Oct. 15, 1996

Related U.S. Application Data

[63] Continuation of Ser. No. 606,246, Feb. 23, 1996, Pat. No. 5,673,224.
[51] Int. Cl.$^6$ ................................................. G06F 12/00
[52] U.S. Cl. ................................. 711/103; 365/185.18
[58] Field of Search ........................... 365/185.11, 201, 365/230.03; 371/40.11; 711/103

[56] References Cited

U.S. PATENT DOCUMENTS

| | | | |
|---|---|---|---|
| 5,270,979 | 12/1993 | Harari et al. | 365/246 |
| 5,297,096 | 3/1994 | Teradu et al. | 365/185.11 |
| 5,297,148 | 3/1994 | Harari et al. | 371/10.2 |
| 5,305,278 | 4/1994 | Inoue | 365/230.03 |
| 5,369,615 | 11/1994 | Harari et al. | 365/218 |
| 5,396,468 | 3/1995 | Harari et al. | 365/218 |
| 5,426,609 | 6/1995 | Okuda | 365/201 |
| 5,430,859 | 7/1995 | Norman et al. | 395/425 |
| 5,438,573 | 8/1995 | Mangan et al. | 371/10.3 |
| 5,471,478 | 11/1995 | Mangan et al. | 371/10.3 |
| 5,504,760 | 4/1996 | Harari et al. | 371/40.11 |

FOREIGN PATENT DOCUMENTS

444774A2  9/1991  European Pat. Off. ........ G06F 13/40

*Primary Examiner*—Tod R. Swann
*Assistant Examiner*—David Langjahr
*Attorney, Agent, or Firm*—Schwegman, Lundberg, Woessner & Kluth, P.A.

[57] ABSTRACT

A method and system in which X-bit packets of bits (where X is an integer) are encoded to generate X-bit packets of encoded bits for writing to erased cells of a flash memory array, where less power is consumed to write a bit having a first value to an erased cell than to write a bit having a second value to the cell. Preferably, a count signal is generated for each packet of raw bits indicating the number of bits of the packet having the first (or second) value, the count signal is processed to generate a control signal which determines an encoding for the packet, and the raw bits of the packet are encoded according to a scheme determined by the control signal. In some embodiments, each erased cell is indicative of the binary value "1", the count signal is compared to a reference value (indicative of X/2) to generate a control signal determining whether the packet should undergo polarity inversion, and the packet is inverted (or not inverted) depending on the value of the control signal. In alternative embodiments, a count signal is generated for each packet of bits to be written to erased cells of an array (where the count signal indicates the number of bits in the packet having a particular value), and each packet is encoded in a manner determined by the corresponding count signal to reduce the power needed to write the encoded bits to the erased cells. Preferably, flag bits indicative of the encoding of each packet are generated, and the flag bits (as well as the encoded packets) are stored in cells of the flash memory array.

52 Claims, 6 Drawing Sheets

SYSTEM AND METHOD FOR ENCODING DATA TO REDUCE POWER AND TIME REQUIRED TO WRITE THE ENCODED DATA TO A FLASH MEMORY

RELATED APPLICATIONS

This is a continuation of application Ser. No. 08/606,246, filed Feb. 23, 1996, now U.S. Pat. No. 5,673,224, issued Sep. 30, 1997 entitled SEGMENTED NON-VOLATILE MEMORY ARRAY WITH MULTIPLE SOURCE WITH IMPROVED WORD LINE CONTROL CIRCUITRY.

BACKGROUND OF THE INVENTION

1. Field of the Invention

The invention pertains to a memory system having an array of flash memory cells and a controller (e.g., one embodiment is a flash memory system of this type which emulates a magnetic disk drive). Aspects of the invention are methods and apparatus which encode packets of data bits to be written to erased flash memory cells so as to reduce the average power and time needed to write the packets to the cells. In preferred embodiments, the invention generates a count indicative of how many bits of each packet would require programming of cells if the packet were written to the cells without being encoded, and encodes the packets according to the count (preferably by inverting the polarity of each packet for which the bit count exceeds a preset value).

2. Description of Related Art

It is conventional to implement a memory circuit as an integrated circuit which includes an array of flash memory cells and circuitry for independently erasing selected blocks of the cells and programming selected ones of the cells. FIG. 1 is a simplified block diagram of such an integrated circuit (flash memory chip 103). To enable such an integrated flash memory chip (or a memory system including such a memory chip) to implement the present invention, its controller (controller 29 of FIG. 1) would be replaced by a controller which implements the invention (including by encoding packets of data received from a host processor in accordance with the invention), and optionally also an appropriate host interface would be provided between the controller and circuitry external to the chip.

Memory chip 103 of FIG. 1 includes flash memory array circuit 16 (comprising rows and columns of nonvolatile flash memory cells), I/O pins DQ0–DQ15 (for asserting output data to an external device or receiving input data from an external device), input buffer circuits 122, 122A, and 122B, output buffer circuits 128, 128A, and 128B, address buffer 17 for receiving address bits A0 through A17 from an external device, row decoder circuit (X address decoder) 12, column multiplexer circuit (Y multiplexer) 14, and control unit 29 (also denoted herein as "controller" 29).

Each of the cells (storage locations) of memory array circuit 16 is indexed by a row index (an "X" index determined by decoder circuit 12) and a column index (a "Y" index determined by Y decoder circuit 13 of circuit 14). Each column of cells of memory array 16 comprises "n" memory cells, each cell implemented by a single floating-gate N-channel transistor. The drains of all transistors of a column are connected to a bitline, and the gate of each of the transistors is connected to a different wordline, and the sources of the transistors are held at a source potential (which is usually ground potential for the chip during a read or programming operation). Each memory cell is a nonvolatile memory cell since the transistor of each cell has a floating gate capable of semipermanent charge storage. The current drawn by each cell (i.e., by each of the N-channel transistors) depends on the amount of charge stored on the cell's floating gate. Thus, the charge stored on each floating gate determines a data value that is stored "semipermanently" in the corresponding cell. In cases in which each of the N-channel transistors is a flash memory device, the charge stored on the floating gate of each is erasable (and thus the data value stored by each cell is erasable) by appropriately changing the voltage applied to the gate and source (in a well known manner).

The individual memory cells (not depicted) are addressed by eighteen address bits (A0–A17), with nine bits being used by X decoder circuit 12 to select the row of array 16 in which the target cell (or cells) is (or are) located and the remaining nine bits being used by Y decoder circuit 13 (of Y-multiplexer 14) to select the appropriate column (or columns) of array 16. Typically, a set of eight or sixteen target cells (or 256 target cells) in a single row of the array are selected by a single set of eighteen address bits A0–A17, with Y decoder circuit 13 determining the column addresses of such cells in response to a nine-bit subset of the set of address bits. In response to the other nine address bits A0–A17, X decoder circuit 12 determines a row address which selects one cell in each selected column.

In a normal operating mode, chip 103 executes a write operation as follows. Address buffer 17 asserts appropriate ones of address bits A0–A17 to circuit 14 and decoder circuit 12. In response to these address bits, circuit 14 determines a column address (which selects one of the columns of memory cells of array 16), and circuit 12 determines a row address (which selects one cell in the selected column). In response to a write command supplied from controller 29, a signal (indicative of a bit of data) present at the output of input buffer 122, 122A, and/or 122B is asserted through circuit 14 to the cell of array 16 determined by the row and column address (e.g., to the drain of such cell). During such write operation, output buffers 128, 128A, and 128B are disabled. Depending on the value of the data bit, the cell is either programmed or it remains in an erased state.

In the normal operating mode, chip 103 executes a read operation as follows. Address buffer 17 asserts appropriate ones of address bits A0–A17 to circuit 14 and address decoder circuit 12. In response to these address bits, circuit 14 asserts a column address to memory array 16 (which selects one of the columns of memory cells), and circuit 12 asserts a row address to memory array 16 (which selects one cell in the selected column). In response to a read command supplied from control unit 29, a current signal indicative of a data value stored in the cell of array 16 (a "data signal") determined by the row and column address is supplied from the drain of the selected cell through the bitline of the selected cell and then through circuit 14 to sense amplifier circuitry 33. This data signal is processed in amplifier circuitry 33, buffered in output buffers 128, 128A, and/or 128B, and finally asserted at pins DQ0–DQ15. During such read operation, input buffers 122, 122A, and 122B are disabled.

Chip 103 also includes a pad which receives a high voltage $V_{pp}$ from an external device, and a switch 121 connected to this pad. During some steps of a typical erase or program sequence (in which cells of array 16 are erased or programmed), control unit 29 sends a control signal to switch 121 to cause switch 121 to close and thereby assert the high voltage $V_{pp}$ to various components of the chip including X decoder 12. Voltage $V_{pp}$ is higher (typically $V_{pp}$=12 volts) than the normal operating mode supply voltage (typically $V_{cc}$=5 volts or $V_{cc}$=5.5 volts) for the MOS transistors of chip 103.

When reading a selected cell of array 16, if the cell is in an erased state, the cell will conduct a first current which is converted to a first voltage in sense amplifier circuitry 33. If the cell is in a programmed state, it will conduct a second current which is converted to a second voltage in sense amplifier circuitry 33. Sense amplifier circuitry 33 determines the state of the cell (i.e., whether it is programmed or erased corresponding to a binary value of 0 or 1, respectively) by comparing the voltage indicative of the cell state to a reference voltage. The outcome of this comparison is an output which is either high or low (corresponding to a digital value of one or zero) which sense amplifier circuitry 33 sends to output buffers 128 and 128B (and through multiplexer 124 to output buffer 128A). One or more of the output buffers in turn asserts a corresponding data signal to corresponding ones of pins DQ0–DQ15 (from which it can be accessed by an external device).

It is important during a write operation to provide the wordline of the selected cell with the proper voltage and the drain of the selected cell with the appropriate voltage level (the voltage determined by the output of each input buffer, asserted through latch/multiplexer 130' to circuit 14), in order to successfully write data to the cell without damaging the cell.

Internal state machine 120 of control unit 29 of chip 103 controls detailed operations of chip 103 such as the various individual steps necessary for carrying out programming, reading, and erasing operations. State machine 120 thus functions to reduce the overhead required of a processor (not depicted) typically used in association with chip 103.

Memory operations, including programming, reading, and erasing can be initiated in various ways. For all operations, the chip enable signal $\overline{CE}$ must be made active. To perform a read operation, write enable signal $\overline{WE}$ must be made inactive. For a write operation, signal $\overline{WE}$ must be made active. In order to reduce the likelihood of accidental modification of data, erase and program operations require receipt of two consecutive commands that are processed by command execution logic unit 124. The program and erase commands are provided by the associated processor to data I/O pins DQ0–DQ7, forwarded to input buffer 122, and then forwarded to the command execution logic unit 124 for processing.

If memory array 16 is to be erased (typically, all or large blocks of cells are erased at the same time), the processor causes the Output Enable $\overline{OE}$ pin to be inactive, and the Chip Enable $\overline{CE}$ and Write Enable $\overline{WE}$ pins to be active. The processor then issues an 8 bit command 20H (0010 0000) on data I/O pins DQ0–DQ7, typically called an Erase Setup command. This is followed by issuance of a second eight bit command D0H (1101 0000), typically called an Erase Confirm command. Two separate commands are used to reduce the possibility of an inadvertent erase operation.

The commands are transferred to data input buffer 122, and the commands are then transferred to command execution logic unit 124 of control unit 29. Logic unit 124 then instructs state machine 120 to perform all the numerous and well known steps for erasing array 16.

Once an erase sequence is completed, state machine 120 updates an 8 bit status register 126, the contents of which are transferred to data output buffer 128A which is connected to data I/O pins DQ0–DQ7 of the memory system. The processor periodically polls the data I/O pins to read the contents of status register 126 in order to determine whether an erase sequence has been completed and whether it has been completed successfully.

During a typical erase operation, it is desired to erase all the cells of array 16 (or an erase block of the cells) so that the threshold voltages are all within a specified voltage range. That range is typically a small positive voltage range such as from +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). An example of a flash memory array which can be employed as memory array 16 of chip 103 is described in U.S. patent application Ser. No. 08/606,246, now U.S. Pat. No. 5,673,224 issued Sep. 30, 1997, entitled "Segmented Non-Volatile Memory Array with Multiple Sources with Improved Word Line Control Circuitry," and assigned to the assignee of the present application, the specification of which is incorporated herein by reference.

The present invention is useful as an improvement to flash memory systems, such as those of the type designed to emulate magnetic disk drive systems. This type of flash memory system is typically implemented as a card (for insertion into a computer system) with a chip set mounted thereon, where the chip set includes an onboard controller and several memory chips controlled by the controller. Each memory chip implements an array of flash memory cells organized into independently erasable blocks. A conventional flash memory system of this type can be modified in accordance with the invention to reduce the average time required to write packets of data bits (received from an external source) to the flash memory array.

In the past, magnetic hard disk systems have been the dominant storage media for computers and related systems. The support of magnetic disk systems is evident by the software associated with the disk drives. The dominant computer operating system known as "DOS" (Disk Operating System) is essentially a software package used to manage a disk system. DOS has been developed by IBM Corporation, Microsoft Corporation, and Novell as the heart of widely used computer software. The first generation of Microsoft Corporation's "Windows" operating system software was essentially a continuation of the original DOS software with a user friendly shell added for ease of use.

The DOS software was developed to support the physical characteristics of hard drive structures, supporting file structures based on heads, cylinders and sectors. The DOS software stores and retrieves data based on these physical attributes. Magnetic hard disk drives operate by storing polarities on magnetic material. This material is able to be rewritten quickly and as often as desired. These characteristics has allowed DOS to develop a file structure that stores files at a given location which is updated by a rewrite of that location as information is changed. Essentially all locations in DOS are viewed as fixed and do not change over the life of the disk drive being used therewith, and are easily updated by rewrites of the smallest supported block of this structure. A sector (of a magnetic disk drive) is the smallest unit of storage that the DOS operating system will support. In particular, a sector has come to mean 512 bytes of information for DOS and most other operating systems in existence. DOS also uses clusters as a storage unit. Clusters, however, are nothing more than the logical grouping of sectors to form a more efficient way of storing files and tracking them with less overhead.

The development of flash memory integrated circuits has enabled a new technology to offer competition to magnetic hard drives and offer advantages and capabilities that are hard to support by disk drive characteristics and features. The low power, high ruggedness, and small sizes offered by a solid state flash memory system make such a flash memory system attractive and able to compete with a magnetic hard disk drive system. Although a memory implemented with flash memory technology may be more costly than a hard disk drive system, computers and other processing systems are being developed that require (or benefit greatly from) use of flash memory features.

Thus, flash memory systems have been developed that emulate the storage characteristics of hard disk drives. Such a flash memory system is preferably structured to support storage in 512 byte blocks along with additional storage for overhead associated with mass storage, such as ECC (error correction code) bits. A key to this development is to make the flash memory array respond to a host processor in a manner that looks like a disk so the operating system can store and retrieve data in a known manner and be easily integrated into a computer system including the host processor.

In some flash memory systems that emulate the storage characteristics of hard disk drives, the interface to the flash memory is identical to a conventional interface to a conventional magnetic hard disk drive. This approach has been adopted by the PCMCIA standardization committee, which has promulgated a standard for supporting flash memory systems with a hard disk drive protocol. A flash memory card (including one or more flash memory array chips) whose interface meets this standard can be plugged into a host system having a standard DOS operating system with a PCMCIA-ATA (or standard ATA) interface. Such a flash memory card is designed to match the latter standard interface, but must include an onboard controller which manages each flash memory array independent of the host system. We next describe a typical technique for storing sectors or files of data in a flash memory array having the structure shown in FIG. 2. This structure may be suitable for low cost applications of the type commonly implemented using low cost magnetic disk drives. Flash memory array 116 of FIG. 2 has 544 bytes per row of flash memory cells (each byte consisting of eight bits, where each memory cell is capable of storing one bit). Thus, each row of cells is equivalent to a magnetic disk sector (512 bytes of data plus 32 bytes of "overhead").

Memory array 116 of FIG. 2 is partitioned into large "decode" blocks of cells (e.g., eight large decode blocks as shown in FIG. 2 or ten large decode blocks) that are physically isolated from one another. This partitioning of blocks allows defects in one decode block (e.g., decode block 16A) to be isolated from the other decode blocks in the array, allows defective decode blocks to be bypassed by a controller, and allows for high usage of die and enhances overall yield of silicon produced (driving down the cost of flash mass storage systems).

Each decode block is subdivided into a number of independently erasable blocks (e.g., eight "erase" blocks as shown in FIG. 2), sometimes referred to herein as "erase blocks." In the FIG. 2 example, each erase block (e.g., erase block 16B) consists of rows of flash memory cells, with each row being capable of storing seventeen "packets" of binary bits, and each packet consisting of 32 bytes (each byte consisting of eight binary bits). Thus, each row (capable of storing 544 byte) corresponds to one conventional disk sector (comprising 544 bytes), and each row can store 512 bytes of data of interest as well as 32 ECC bytes for use in error detection and correction (or 32 "overhead" bits of some type other than ECC bits). In the FIG. 2 example, each erase block corresponds to two "cylinders" of data (in the sense that this expression is used in a conventional magnetic disk drive), with each cylinder consisting of 256K bits of data organized into 64 sectors. Thus, each erase block in the FIG. 2 example consists of 128 sectors of data.

Still with reference to FIG. 2, each erase block (e.g., erase block 16B) can be independently erased in response to signals from the controller. All flash memory cells in each erase block are erased at the same (or substantially the same) time, so that erasure of an erase block amounts to erasure of a large portion of array 116 at a single time.

Stored data can be read from typical flash memories at higher speeds than from typical existing disk drives, since a flash memory system does not have mechanical delays such as seeks and rotational delays that are required for drive operation. This capability makes flash memories particularly useful in applications where read access is very important to users (e.g., it may be desirable to use a flash memory system as a cache to a traditional disk system).

However, conventional flash memory systems have slow write rates compared to those of DRAMS and SRAMS (and even disk drives in some applications). The programming mechanism for capturing charge in the floating gate of a cell of a flash array (in order to store a bit in such cell) is slow compared to the mechanism required to store a bit of data using these other technologies. While the write rate is often slower for conventional flash memories than it is for disk drives, in many cases a flash memory system will operate faster than a disk drive for storing data. This can occur because a flash memory does not have mechanical delays for moving a magnetic head to a desired storage location as are inherent in a disk drive before starting a write operation. Often, a flash memory system (of the type which emulates a disk drive) will be able to receive data and store it in a flash memory array in less time than required for the actuator of a hard disk drive to move to a desired storage location on a disk. However, as the length of a file being stored (the amount of data being stored) increases, this initial advantage of flash technology over disk technology will be overcome, and the faster-writing hard disk will catch up and surpass the flash memory (e.g., the disk will require less total time to store a sufficiently long file of data).

It would be desirable to improve existing technology for writing data to a flash memory array to allow storage of data (even large volumes of data, e.g., long files of data) more rapidly. One method of doing so would be to store data in wide words, where many bits are written at one time (each bit to a different cell of a flash memory array). While this would help speed up the write process it will demand more power of the flash system.

The high voltage required to program flash memory cells has traditionally been generated (or partially generated and regulated) internal to the flash memory device. The lack of inductors or the ability to include large capacitors in a solid state flash design limits the amount of charge that can be generated and stored on a flash memory chip. To program more and more bits during a single short-duration operation requires more power and has heavier demands on the on-chip "pump" circuitry for supplying high power to the flash memory cells. As the demand for power from the pump circuitry increases, each particular implementation of the pump circuitry will reach its limit and will begin to droop in its output power, reducing the efficiency of the programming operation, even to the point of causing programming failure if loaded heavily.

The present invention provides a way to write many data bits (a long packet of data) during a short-duration operation to many flash memory cells, with substantially reduced power consumption relative to the prior art.

Another problem addressed by the present invention pertains to the statistical effect of programming large numbers of bits simultaneously. Due to differences in the characteristics of cells in a single flash array (e.g., due to the manufacturing tolerances), the bits of a group of bits being programmed in parallel (to a corresponding number of flash memory cells) will not all program at the same rate, so that the rate of programming the group of bits is governed by the slowest bit in that group to achieve the programmed state. This difference in speeds will cause nearly all bits being programmed within a group to see longer program conditions than if each were being programmed alone. This extended programming will cause additional stress on cells of a flash memory array and is a contributor to premature cell wear out (reduced operating lifetime).

Another problem addressed by the present invention pertains to the total time required to write large numbers of bits sequentially (during a single write operation) to erased flash memory cells. The average total time required to write the bits of an X-bit group of bits (where X is a large number and the average is over a number of writes of the group, assuming random values of the bits of during each write) sequentially to a corresponding number of flash memory cells will depend on the average value of the bits. Thus, if the bits are binary bits, and they are written to erased flash memory cells (each erased cell indicative of the value "1"), a greater time is needed to write the bits to the cells when the bits are entirely (or mostly) "0" bits than when the bits are entirely (or mostly) "1" bits.

In addition to reducing power requirements for writing many bits simultaneously (or as part of a single short-duration operation), the present invention reduces the average time for writing X-bit packets of bits to a flash memory array (for any given value of X), and increases the average operating lifetime of the array's cells (where two or more streams of the bits are written in parallel to the cells). This is true since the invention reduces (to a number less than X) the average number of cells that must be programmed to accomplish writing of X-bit packets of data to a flash memory (where the average is over a number of writes of such packets, assuming random values of the bits of each packet).

A flash memory system consumes less power when a bit having a first logical value is written to a cell thereof than when a bit having another logical value is written to an erased cell. In particular, where each cell is indicative of a binary data bit, and the cell is indicative of a bit having a first logical value, a substantial amount of power is required to program the cell (to cause it to change state to become indicative of a bit having a second logical value), but no power is required to "write" a bit having the first logical value to the erased cell.

Typically (in cases in which each cell of a flash memory array is indicative of a binary data bit), the logical value of the data bit indicated by an erased flash memory cell is considered to be the logical value "1," and the logical value of the binary data bit indicated by a programmed flash memory cell is considered to be the logical value "0."

A typical implementation of a flash memory array comprises rows and columns of flash memory cells, with each row consisting of cells connected along a common wordline, and each column consisting of cells connected along a common bitline. Each cell is implemented by a floating-gate N-channel transistor. The drains of each column of such transistors are connected to a common bitline, the gate of each is connected to a different wordline, and the source of each is held at a source potential (which is usually ground potential for flash memory chip during a program or read operation). Each cell is a nonvolatile memory cell, since it has a floating gate capable of semipermanent charge storage. The current drawn by each cell depends on the amount of charge stored on the cell's floating gate. Thus, the charge stored on each floating gate determines a data value that is stored semipermanently in the corresponding cell. The charge stored on the floating gate of each cell can be reduced (and thus the data value stored by each cell is erasable) by appropriately changing the voltage applied to the gate and source in a well known manner. Conventionally, the logical value of a binary data bit indicated by an erased flash memory cell of this type (which has charge below a particular level on its floating gate) is considered to be the logical value "1," and the logical value of a binary data bit indicated by a programmed flash memory cell of this type (which has charge above a particular level on its floating gate) is considered to be the logical value "0."

It has been proposed to "level" (i.e., make more uniform) the erasure/programming history of sectors of cells of an electrically erasable programmable read only memory (EEPROM), such as a flash EEPROM, by sequentially (or randomly) inverting the polarity of sets of binary data sequentially written to each sector of the cells. For example, U.S. Pat. No. 5,396,468 (issued Mar. 7, 1995) and U.S. Pat. No. 5,369,615 (issued Nov. 29, 1994) teach inverting the polarity of sets of binary data to be written to a sector of cells of an EEPROM as follows. A set of data (indicative of multiple bits of binary data) is written to the sector, then the polarity of the next set to be written to the sector is automatically inverted (each bit indicative of a logical "1" is replaced by a bit indicative of a logical "0" and vice versa) and the resulting set of inverted bits is written to the sector, then the next set of data is written to the sector without being inverted, and so on. The references also teach inverting the polarity of successive sets (to be written to a sector) on a random basis, as an alternative to inverting the polarity of every other set to be written.

However, such predetermined alternating (or random) polarity inversion of sets of data bits to be written to an EEPROM is very different from selective inversion of the polarity of a packet of data in accordance with the present invention (in response to determining the number of bits of the packet which are indicative of a particular logical value), and would not achieve the advantages achieved by the present invention. In particular, predetermined alternating (or random) polarity inversion of packets would neither reduce the average power consumption required to write the packets to a flash memory (averaged over many writes of packets, assuming random values of the bits of each packet), nor would it reduce the average time for writing each packet to the flash memory (again averaged over many writes of packets, assuming random values of the bits of each packet).

It has also been proposed (in European Patent Application Publication Number 444,774 A2, published on Sep. 4, 1991) to employ logic circuitry (of an unspecified type) to count the number of bits of an N-bit data word (to be written to a memory) which are indicative of a logical "zero," to invert the polarity of the N-bit word if it comprises more bits indicative of a logical "zero" than bits indicative of a logical "one" (or not invert the word's polarity if the word comprises more bits indicative of a logical "one" than bits indicative of a logical "zero"), and to write the encoded (inverted or not inverted) word to the memory with a bit identifying whether or not the encoded word has been inverted. However, it would not be practical to implement this technique in cases in which N is a large number (e.g., where N is much greater than eight). In contrast, in accordance with preferred embodiments of the invention, a set of data (consisting of N binary bits) is processed on a packet-by-packet basis (preferably in a particularly efficient manner, using a converter and circuitry for accumulating a sequence of outputs of the converter) to encode each packet selectively in response to determining whether more than (or less than) half of the bits of each packet are indicative of a first binary level (a logical "one" or "zero"), where each packet consists of X of the binary bits in the set, and the set consists of more than X of the binary bits.

SUMMARY OF THE INVENTION

In preferred embodiments, the memory system of the invention includes an array of flash memory cells, encoding circuitry which receives and encodes X-bit packets of binary bits (where X is an integer) to generate encoded binary bits, and circuitry which writes X-bit packets of the encoded bits to erased cells of the array. Preferably also, the system includes circuitry which reads packets of encoded bits from the array and decodes each packet appropriately. The system consumes less power to write a bit having a first logical value to an erased cell than to write a bit having a second logical value to the erased cell, and the encoding circuitry encodes each packet of X bits to generate a packet of X encoded bits consisting of P encoded bits having the first logical value and Q encoded bits having the second logical value, where X=P+Q, and P is not less than Q.

Preferably, the encoding circuitry generates a count signal (for each packet of X raw bits) indicating the number of raw bits of the packet having the first (or second) logical value, processes the count signal to generate a control signal which determines a type of encoding for the packet, and then encodes the raw bits of the packet according to the encoding scheme determined by the control signal.

In a class of preferred embodiments, each cell of the array is a floating-gate N-channel transistor which stores a binary bit, each erased cell is indicative of the value "1," and the encoding circuitry encodes each received packet to generate a packet of encoded bits consisting of P encoded bits indicative of the value "1" and Q encoded bits indicative of the value "0", where P is not less than Q. In some such embodiments, the encoding circuitry generates a count signal (for each packet of X raw bits) indicating the number of bits of the packet indicative of the value "1", compares the count signal to a reference value (indicative of X/2) to generate a control signal which determines whether the packet should undergo polarity inversion, and then inverts (or does not invert) the raw bits of the packet depending on the value of the control signal. In some such embodiments, the array is organized into rows of cells, each row (sometimes denoted as a sector) can store a quantity of bits corresponding to a magnetic disk drive sector, and the system stores several packets of encoded bits (e.g., sixteen 256-bit packets of encoded bits and an additional 256-bit packet of overhead data) in each row. A packet is the grouping of bits (or bytes) that comprise the basic unit of programming for a flash memory array. In the embodiments in which a packet consists of 256 bits (thirty-two 8-bit bytes), all such 256 bits are typically programmed at substantially the same time (in parallel). The present invention teaches how to calculate the polarity of a packet for minimum programming, how to transfer packets of data (each with the selected polarity), and how to perform the programming operation (to write each transferred packet to the memory array).

The flash memory array can be implemented as a single integrated memory circuit (memory chip), as a portion of a single memory chip, or as two or more memory chips.

Other embodiments of the invention are methods and apparatus for generating packets of encoded bits of any of the types described above from packets of raw (non-encoded) bits. In any embodiment of the inventive method, the additional steps of writing each packet of encoded data to erased cells of a flash memory array, and reading (and decoding) the encoded data from the cells are optionally performed.

DETAILED DESCRIPTION OF THE PREFERRED EMBODIMENTS

Figure 1:
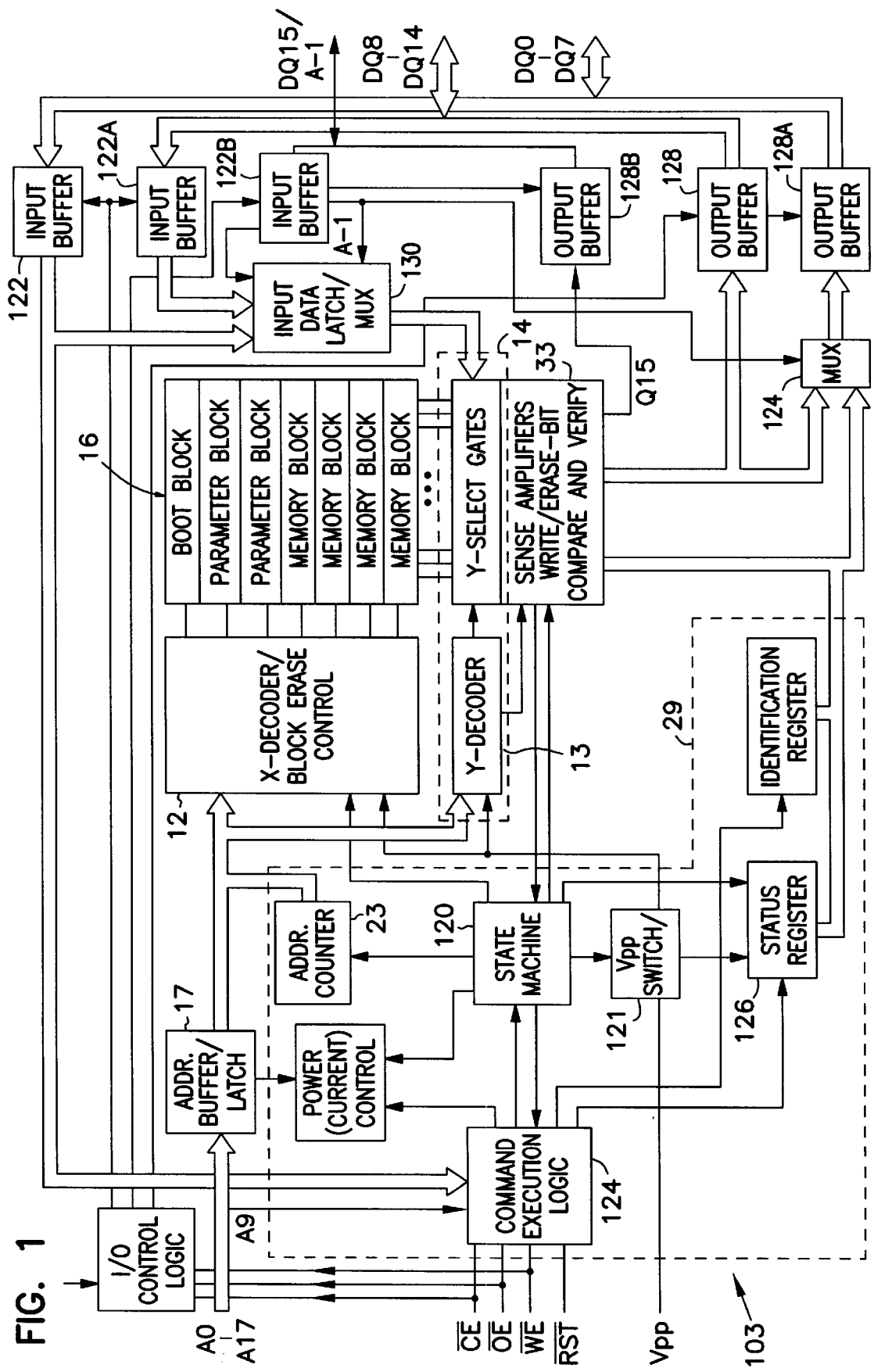
FIG. 1 is block diagram of a conventional nonvolatile (flash) memory circuit (implemented as an integrated circuit), including a conventional controller for controlling memory operations of the circuit.

Throughout the disclosure, the terms "bit" and "data bit" are used interchangeably to denote a signal, where the signal is indicative of a data value, and the signal can be stored in a single flash memory cell of a flash memory array. In the preferred embodiments, a "bit" is a signal which is indicative of a binary value (either a "0" or a "1"). In alternative embodiments, for use with a flash memory array implemented so that each cell stores an M-value bit (i.e., a bit having one of M possible values, where M is an integer greater than one), a "bit" is a signal indicative of a non-binary value (e.g., one of the decimal values 0, 1, 2, and 3, where M=4).

Preferred embodiments of the invention will be described with reference to FIG. 3. One such embodiment is flash memory chip 3 shown in FIG. 3 which includes array 216 of flash memory cells. Memory chip 3 of FIG. 3 can be identical to chip 103 of FIG. 1, except in that chip 3 includes controller 129 which is designed and programmed in accordance with the invention (rather than controller 29 of FIG. 1). Controller 129 includes host interface 102, multiplexer 230, error detection and correction circuit 132, and flash interface 114.

In preferred implementations, host interface 102 receives binary data and address bits from an external processor (and sends binary data bits from memory array 216 to the external processor). Preferably, the external processor has a standard DOS operating system with a PCMCIA-ATA interface (of the type discussed above), and interface 102 complies with the PCMCIA-ATA standard and thus can communicate with the standard PCMCIA-ATA interface of the external processor.

Figure 2:
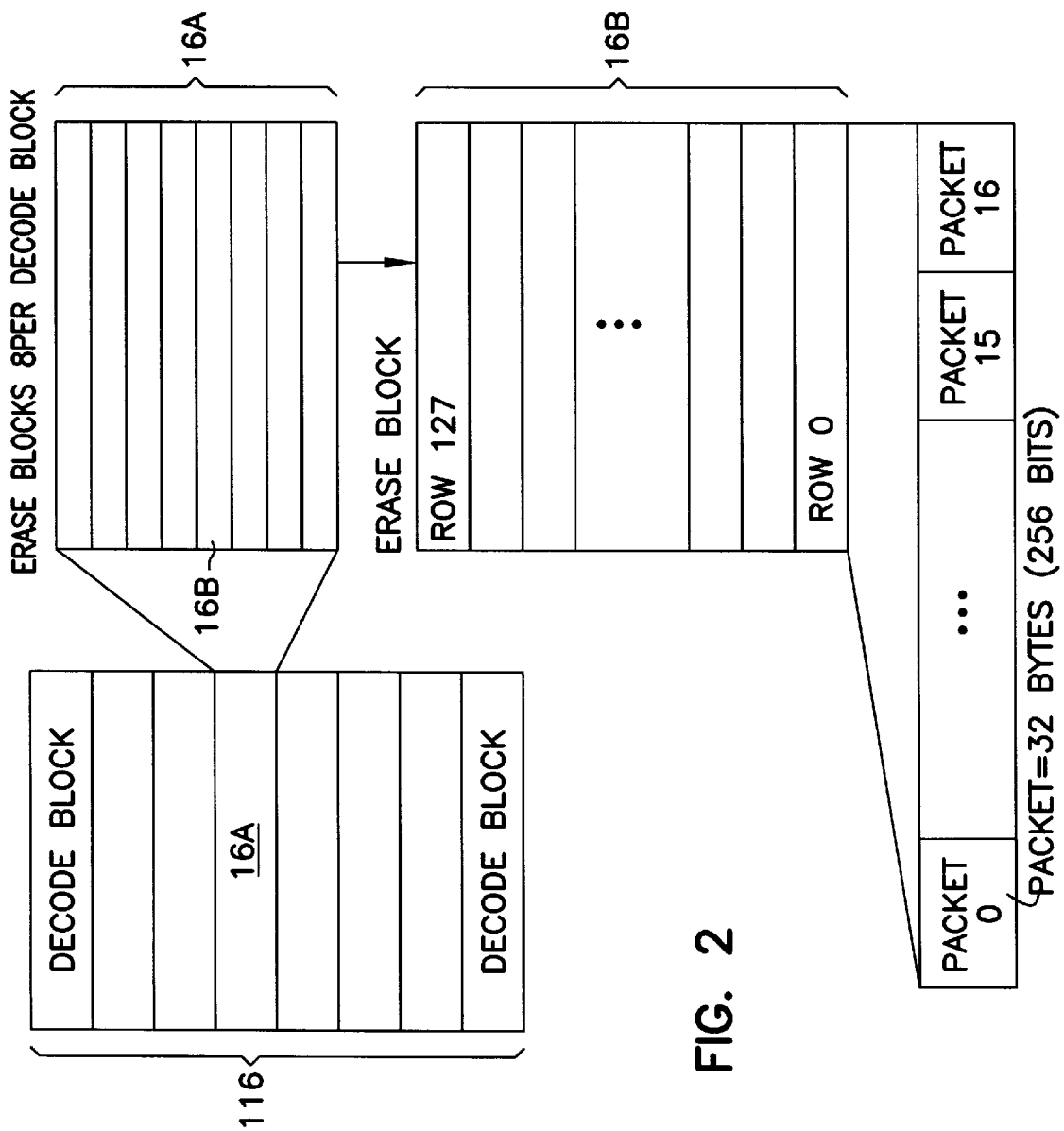
FIG. 2 is a diagram of the manner in which cells of a flash memory array are organized in one flash memory system which emulates a magnetic disk drive.
Figure 3:
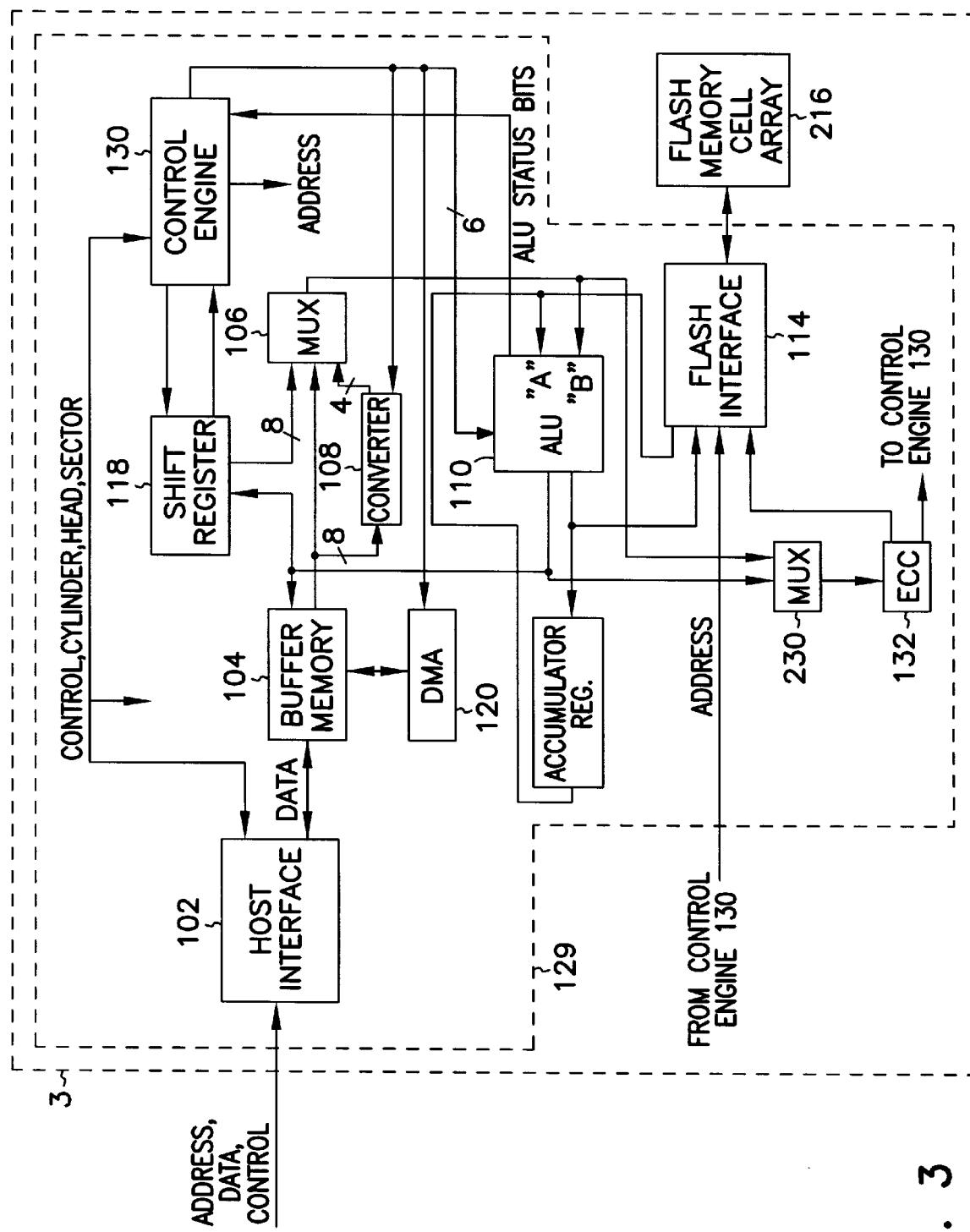
FIG. 3 is a block diagram of an embodiment of the integrated flash memory system of the invention.

Flash memory array 216 of FIG. 3 preferably includes a cell array identical to array 116 of FIG. 2 (which can be identical to array 16 of FIG. 1) and circuitry which performs the functions of elements 12, 14, and 33 of FIG. 1. Flash interface 114 receives data (to be written to array 114) and address bits from other elements of chip 3 and asserts corresponding data and address bits with appropriate timing and format to array 216. Flash interface 114 also receives data bits (read from cells of array 216) and asserts corresponding data bits with appropriate timing and format to other elements of chip 3. The description of those components of FIG. 3 which correspond to components of FIG. 1 has been provided above with reference to FIG. 1, and will not be repeated below.

The cells of flash memory array 216 of FIG. 3 (and the cells of array 16 of FIG. 1) are organized into decode blocks. Each decode block is organized into independently erasable erase blocks (as is each decode block of array 116 shown in FIG. 2).

With reference to FIG. 3, in response to control signals and address bits from an external host, interface 102 sends the address bits (including bits identifying cylinder, head, and sector addresses) to control engine 130 of controller 129, and asserts internal control signals to appropriate components of controller 129 (including control engine 130) as required to implement each memory operation specified by each command signal from the host (e.g., a read of some or all cells of array 216, an erase of one or more erase blocks of array 216, or a write of data to some or all cells of array 216). In response to the host command bytes, control engine 130 generates translated address bits and sends the translated address bits to flash interface 114. Among the internal control signals asserted by interface 102 are enable/disable signals which are asserted (from control engine 130) to converter circuit 108, to turn off circuit 108 at times when it is not needed, thereby avoiding unnecessary power consumption by circuit 108 (e.g., due to unnecessary toggling of transistor gates within circuit 108). Preferably, circuit 108 is inactive (i.e., in a mode which consumes little or no power) unless the encoding process is enabled by an enable signal (e.g., an enable signal from control engine 130). This latter feature reduces power consumption by the system when the encoding operation is not to be performed.

Control engine 130 asserts control signals to the other elements of controller 129 (including elements 106, 108, and 110) and to flash interface 114 in response to the internal control signals it receives from interface 102, to cause controller 129 and interface 114 to execute operations in accordance with the present invention. Control engine 130 includes a sequencer module (sequencer) which determines which set of sub-operations or functions need to be performed to implement the memory operation specified by the host command (e.g., a write of data in buffer memory 104 to array 216, or a read of data from array 216 to buffer memory 104).

Data to be written to array 216 (a set of binary data bits) are received at interface 102, and the data are then written from interface 102 to buffer memory 104 (which is preferably an SRAM circuit). Memory 104 has capacity to store at least one N-bit "sector" of the data bits, and preferably has capacity to store at least two N-bit sectors of the data bits.

In accordance with the invention, each packet of a sector is encoded independently and then written to X cells of array 216 (where X is an integer less than N). Typically, each sector of data consists of several (e.g., sixteen) of the packets.

In preferred implementations, array 216 is organized into erase blocks of cells, each row of each erase block stores a quantity of bits which corresponds to a sector of a magnetic disk drive (and thus each row is sometimes denoted as a sector of cells), and each row stores multiple packets of bits. In one such implementation, memory 104 receives from interface 102 (and stores) a burst of 512 eight-bit bytes of data (4096 bits, or sixteen "packets of 32 eight-bit bytes) and each row of array 216 consists of 4352 cells (and thus each row can store sixteen packets of data plus an additional packet of "overhead" bits, including encoding tag bits and other overhead bits to be discussed below).

Figure 7:
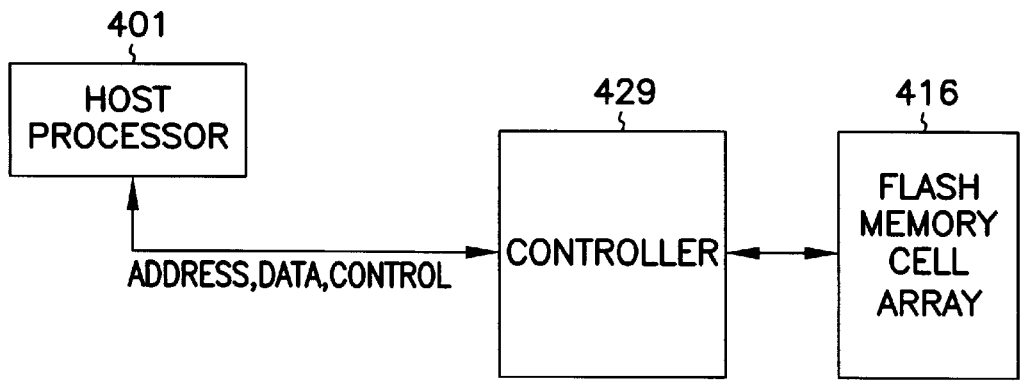
FIG. 7 is a block diagram of a computer system which embodies the present invention.

In variations on the single chip embodiment of FIG. 3, such as that shown in FIG. 7, counterparts to array 216 and controller 129 are implemented in two or more separate chips. Array 216 can itself be replaced by an array implemented in two or more chips.

In the computer system of FIG. 7, controller 429 (implemented as an integrated circuit) performs all the functions of controller 129 (described herein with reference to FIG. 3), and flash memory cell array 416 (implemented as a second integrated circuit) performs all the functions of array 216 (described herein with reference to FIG. 3). The host interface within controller 429 (not shown in FIG. 7) communicates with host processor 401 in the same manner as above-described host interface 102 communicates with an external host processor of the type mentioned above. The computer system of FIG. 7 is another embodiment of the present invention. In variations on this system, array 416 is replaced by an array implemented in two or more chips.

With reference again to FIG. 3, controller 129 includes circuitry (including arithmetic logic unit 110 and accumulator register 112) which can operate in a mode (in response to a control signal from control engine 130) in which it counts the number of bits in each packet of raw (unencoded) data written to memory 104 which have a particular polarity (e.g., which correspond to a particular logical value). For specificity, the following description assumes that each cell of array 216 is a floating-gate N-channel transistor, each erased cell of array 216 is indicative of the logical value "1," controller 129 counts the number of raw bits of each packet (in memory 104) which are indicative of the logical value "1," and controller 129 generates from these raw bits a packet of encoded bits consisting of more encoded bits indicative of the logical value "1" than encoded bits indicative of the logical value "0" (or equal number of encoded bits indicative of the values "1" and "0"). In other memory systems which embody the invention, these logic states are reversed but the same inventive concept still applies, or the sense of the bits which are counted is the opposite (i.e., the number of bits indicative of the logical value "0" is counted), or the sense of the predominant encoded bits in each encoded packet is the opposite.

In other implementations of the FIG. 3 circuit, each cell of array 216 stores an M-value bit (a bit having one of M possible values, where M is any integer greater than two), one or more binary bits stored in buffer memory 104 determine each M-value bit to be written to an erased cell of array 216, controller 129 generates (from each packet of bits stored in memory 104) encoded data determining a packet of M-value encoded bits in accordance with the invention, and interface 114 controls programming of erased cells of array 216 to the appropriate values determined by the packet of M-value encoded bits.

The following description of FIG. 3 also assumes that array 216 is organized into erase blocks of cells, each row of each erase block stores a quantity of bits which corresponds to a magnetic disk drive sector (and thus each row is sometimes denoted as a sector of cells), and each row stores several packets of bits. In one specific implementation, each row (sector) of array 216 consists of 4352 cells (and thus each row can store sixteen 256-bit packets of data plus an additional 256-bit packet of "overhead" bits), memory 104 receives bursts of data from interface 102 (and stores) with each burst consisting of 512 eight-bit bytes of data (4096 bits, or sixteen "packets" of 32 eight-bit bytes), and controller 129 operates on the raw bits of data in memory 104 on a packet-by-packet basis.

With reference to FIG. 3, memory system 3 operates as follows when a quantity of raw bits (including several 256-bit packets of raw bits) to be written to a sector of array 216 has been stored in buffer memory 104. The sequencer (within control engine 130) sets accumulator register 112 to zero, sends a control signal to DMA unit 120 to set the DMA pointer to the start of a sector (so that the pointer selects the first packet of the sector), sets arithmetic logic unit (ALU) 110 to a mode of operation in which it adds the data value asserted to its "A" input to the data value asserted to its "B" input and asserts the sum to accumulator register 112, enables data conversion logic 108 (sometimes referred to as "converter" 108), sets DMA 120 to a mode of operation in which it sequentially asserts the 8-bit bytes of one 256-bit packet from memory 104 to converter 108, and sets multiplexer 106 to a mode of operation in which multiplexer 106 passes the data it receives from converter 108 to ALU 110. Multiplexer 106 can be controlled to select either eight bits of data received in parallel from shift register 118, eight bits of data received in parallel from buffer memory 4, or four bits of data received in parallel from converter 108, and asserting each set of selected bits to ALU 110. If multiplexer 106 selects four bits of data from converter 108, multiplexer 106 concatenates four "zero" bits (four bits, each indicative of the value "zero") with the four bits from converter 108 and asserts the resulting concatenated set of eight bits to ALU 110, so that the four "zero" bits are the most significant bits of the concatenated set of eight bits.

Converter 108 generates a four-bit count value (labelled "C3" in FIG. 4) in response to each 8-bit byte of raw data asserted thereto from memory 104, such four-bit count value being indicative of the number of raw data bits of the byte which are indicative of the logical value "1."

Figure 4:
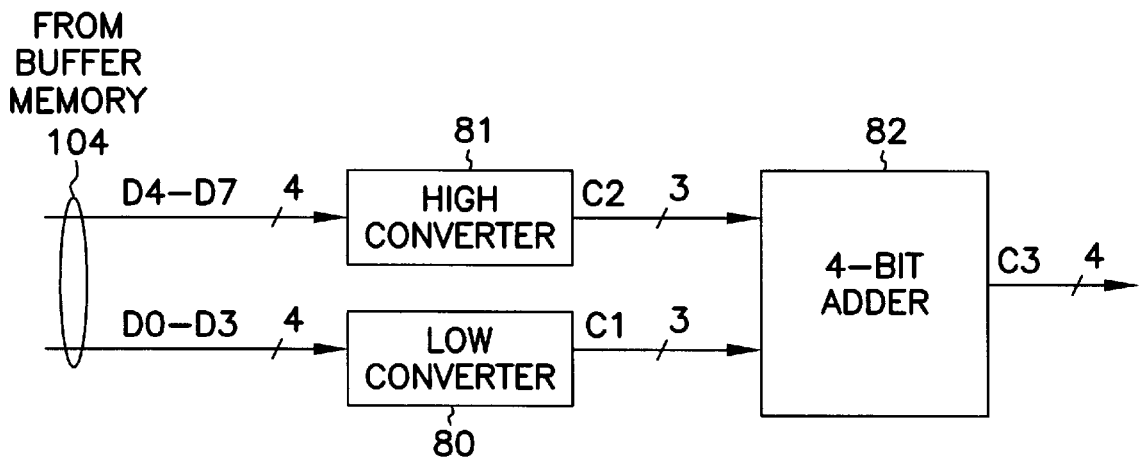
FIG. 4 is a block diagram of a preferred embodiment of converter 108 of FIG. 3.

A preferred embodiment of converter 108 is shown in FIG. 4. The FIG. 4 embodiment of converter 108 includes two identical conversion circuits 80 and 81, and a four-bit adder 82 which adds together the outputs of circuits 80 and 81 thereby generating final count value C3. Count value C3 is a four-bit count of the number of bits of the 8-bit byte of raw data (received at the inputs of circuits 80 and 81) which are indicative of the logical value "1." The count value C3 is asserted from the output of adder to multiplexer 106 (of FIG. 3).

For convenience, we arbitrarily refer to the bits of each 8-bit byte of raw data received at converter 108 (from memory 104) as an ordered set including a least significant bit (D0), a most significant bit (D7), and six intermediate bits (D1–D6).

The four least significant bits (D0–D4) of the byte are asserted to conversion circuit 80. Circuit 80 processes the four input bits, and asserts as a result a three-bit count value (C1) in response to each set of input bits as follows:

| Input bits (D3 D2 D1 D0) | Count Value C1 |
|---|---|
| 0000 | 000 |
| 0001 | 001 |
| 0010 | 001 |
| 0011 | 010 |
| 0100 | 001 |
| 0101 | 010 |
| 0110 | 010 |
| 0111 | 011 |
| 1000 | 001 |
| 1001 | 010 |
| 1010 | 010 |
| 1011 | 011 |
| 1100 | 010 |
| 1101 | 011 |
| 1110 | 011 |
| 1111 | 100 |

Count value C1 is a three-bit count of the number of bits of the 4-bit nibble (received at the input of circuit 80) which are indicative of the logical value "1."

The four most significant bits (D4–D7) of the 8-bit byte (from memory 104) are asserted to conversion circuit 81. Circuit 81 processes these four input bits, and asserts as a result a three-bit count value (C2) in response to each set of input bits as follows:

| Input bits (D7 D6 D5 D4) | Count Value C2 |
|---|---|
| 0000 | 000 |
| 0001 | 001 |
| 0010 | 001 |
| 0011 | 010 |
| 0100 | 001 |
| 0101 | 010 |
| 0110 | 010 |
| 0111 | 011 |
| 1000 | 001 |
| 1001 | 010 |
| 1010 | 010 |
| 1011 | 011 |
| 1100 | 010 |
| 1101 | 011 |
| 1110 | 011 |
| 1111 | 100 |

Count value C2 is a three-bit count of the number of bits of the 4-bit nibble (received at the input of circuit 81) which are indicative of the logical value "1."

Four-bit adder 82 adds count value C1 to count value C2 to generate four-bit count value C3. Thus, count value C3 is a four-bit count of the number of bits of the 8-bit byte (received at the inputs of circuits 80 and 81) which are indicative of the logical value "1."

Figure 5:
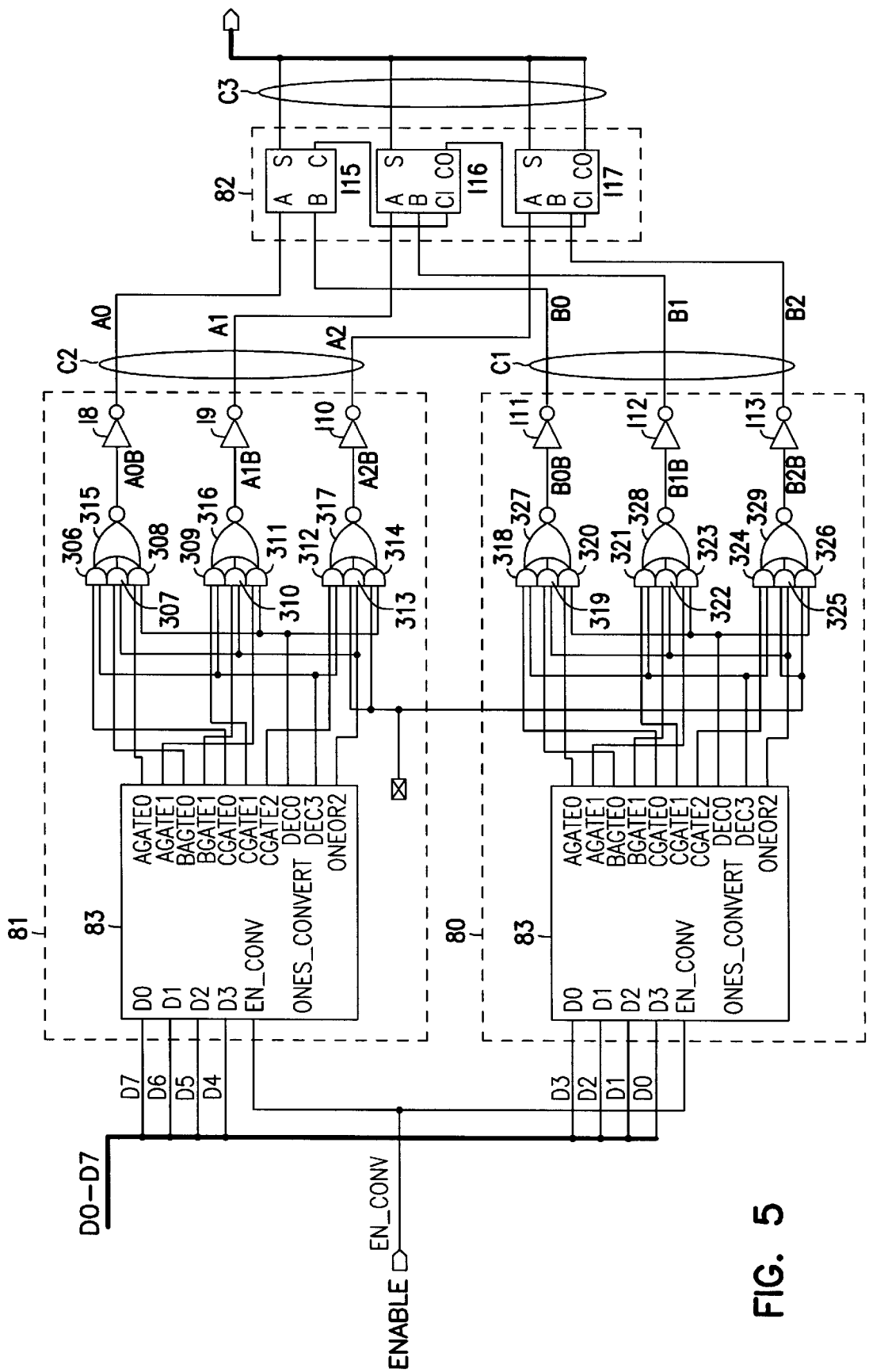
FIG. 5 is a more detailed block diagram of the converter of FIG. 4.

FIG. 5 is a more detailed block diagram of the converter of FIG. 4. As shown in FIG. 5, circuit 81 comprises conversion circuit 83, AND gates 306–314, NOR gates 315–317, and inverters I8–I10 connected as shown, and circuit 80 comprises an identical conversion circuit 83, AND gates 318–326, NOR gates 327–329, and inverters I11–I13 connected as shown. Circuit 83 of circuit 81 receives above-mentioned bits D4–D7 and enable signal ENABLE, and circuit 83 of circuit 80 receives above-mentioned bits D0–D3 and enable signal ENABLE.

Figure 6:
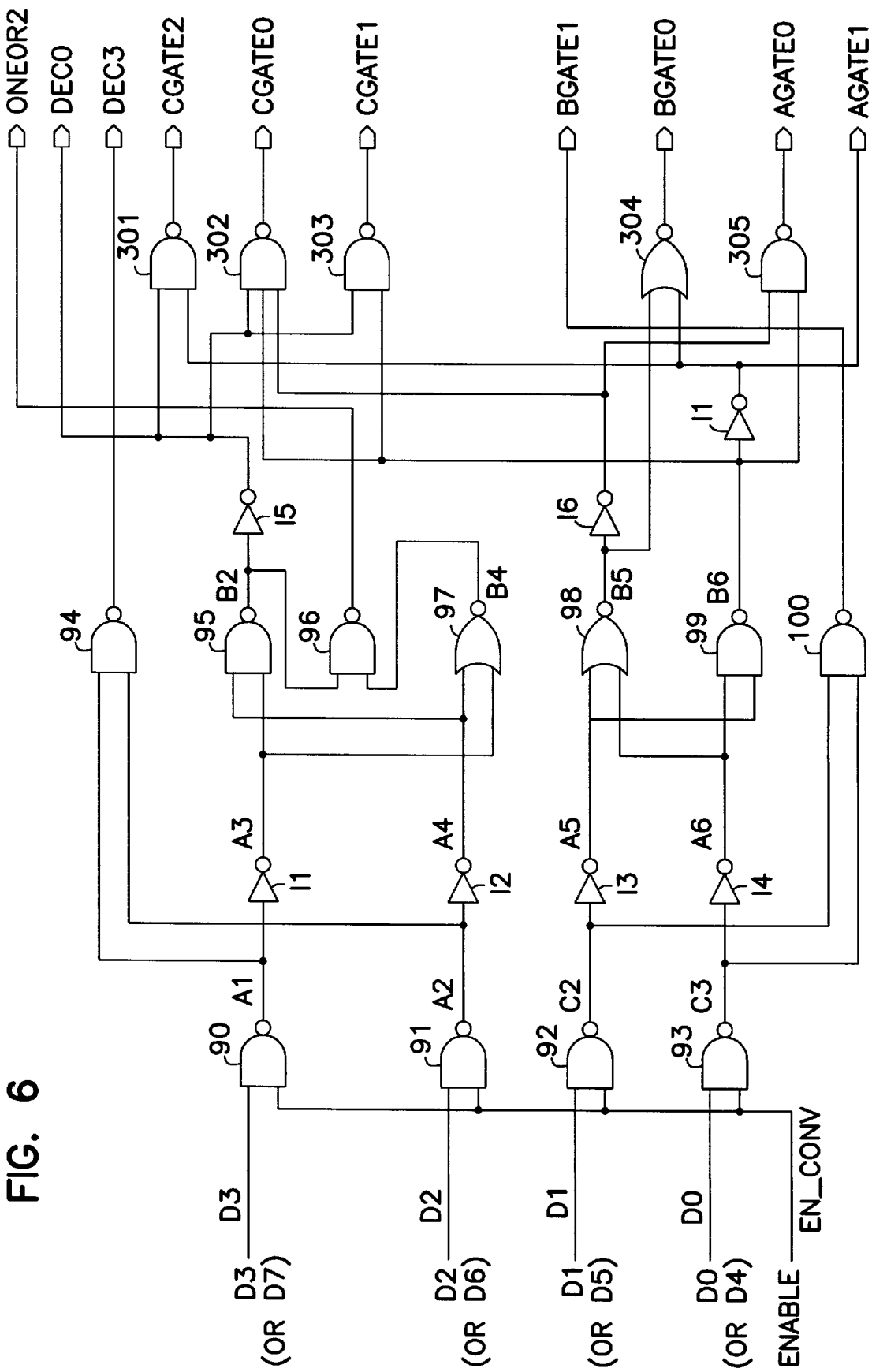
FIG. 6 is a schematic diagram of a preferred embodiment of circuit 83 of FIG. 5.

FIG. 6 is a schematic diagram of a preferred embodiment of each circuit 83 of FIG. 5. The FIG. 6 embodiment of circuit 83 comprises NAND gates 90–93, 95, and 99–100, AND gates 94, 96, 301, 302, 303, and 305, OR gates 97 and 304, NOR gate 98, and inverters I1–I7 connected as shown.

Figure 4A:
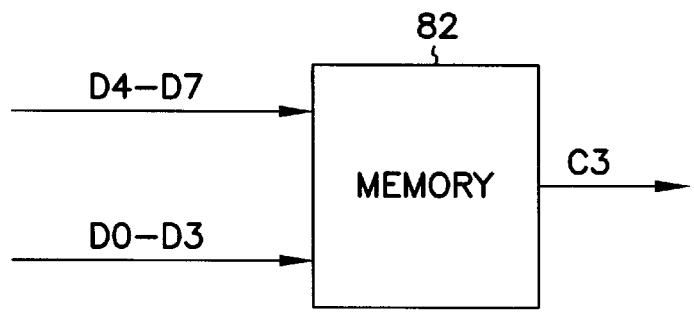
FIG. 4A is a block diagram of an alternative embodiment of converter 108 of FIG. 3.

Another embodiment of converter 108 is shown in FIG. 4A. The FIG. 4A embodiment of converter 108 is a memory (a RAM, ROM, or EEPROM circuit) which implements a look-up table for asserting four-bit count value C3 in response to each eight-bit data byte D0–D7 received by the converter. Such a look-up table implementation is easy to implement, but will typically require more die space than the gate circuitry described with reference to FIGS. 4, 5, and 6.

With reference again to FIG. 3, multiplexer 106 asserts four-bit count value C3 (concatenated with four "zero" bits as noted above) to one input of ALU 110 (the input labeled "B" in FIG. 3). The other input of ALU 110 (labeled "A" in FIG. 3) receives the eight-bit value currently stored in accumulator register 112, and ALU adds the values received at its two inputs and asserts the sum to accumulator register 112 (to replace the eight-bit value currently stored in register 112).

Unit 129 repeats the above-described steps for each of a sequence of eight-bit bytes of raw data that it reads from buffer memory 104 until it has processed an entire packet of raw data stored in memory 104. As unit 129 does so, accumulator register 112 accumulates a count indicating the cumulated number of the processed bits of raw data (in the packet) that are indicative of the logical value "1." After unit 129 has completed such processing of a packet of raw data, control engine 130 causes ALU 110 to compare the contents of accumulator 112 with a binary value indicative of M/2, where M is the number of bits comprising the packet. ALU 110 asserts a signal to control engine 130 indicating whether or not the contents of accumulator 112 are not indicative of a value less than M/2. If the contents of accumulator 112 are indicative of a value less than M/2, then control engine 130 writes a code bit into shift register 118 (indicating that the polarity of this packet of data is to be inverted) and control engine 130 sets ALU 110 to operate in a mode in which it inverts data received at its "B" input. Otherwise (where the contents of accumulator 112 are indicative of a value greater than or equal to M/2), control engine 130 writes another code bit (or set of code bits) into shift register 118 (indicating that the polarity of this packet of data is not to be inverted) and control engine 130 sets ALU 110 to operate in a mode in which it does not alter (and instead passes through to its output terminal) data received at its "B" input.

In preferred embodiments in which each packet read from memory 104 consists of 256 bits, control engine 130 causes ALU 110 to compare the contents of accumulator 112 with the binary value "01000000" (indicative of the decimal value 128=256/2). In such embodiments, control engine 130 can accomplish the comparison as follows. Control engine 130 causes multiplexer 106 to assert the binary value "01000000" to input "B" of ALU 110 (control engine 130 can accomplish this by writing this binary value from a register (not shown) to multiplexer 106, and causing multiplexer 106 to assert the value to input "B" of ALU 110). Control engine 130 also causes the contents of accumulator 112 to be asserted to input "A" of ALU 110, and causes ALU 110 to perform a comparison of the values at its two inputs "A" and "B." ALU 110 asserts status bits to control engine 130 which are indicative of the result of the comparison. If these status bits indicate that the value stored in accumulator 112 is less than the binary value 01000000 (so that the corresponding packet of raw data bits comprises more bits indicative of "0" than "1"), control engine 130 writes a code word into shift register 118 (indicating that the polarity of the packet is to be inverted) and control engine 130 sets ALU 110 to operate in a mode in which it inverts data received at its "B" input. Where status bits indicate that the value stored in accumulator 112 is greater than or equal to the binary value 01000000, control engine 130 writes another code word into shift register 118 (indicating that the polarity of this packet of data is not to be inverted) and sets ALU 110 to operate in a mode in which it passes through (to its output terminal) data received at its "B" input.

Then, control engine 130 causes DMA unit 120 to set the DMA address back by 32 bytes, so that DMA unit 120 causes the same packet of raw data bits to be reread from memory 104 to multiplexer 106 (as a sequence of eight-bit bytes). Also, control engine 130 selects flash interface 114 (rather than register 112) as the unit which receives the output of ALU 110. Multiplexer 106 asserts the raw data to ALU 110, and ALU 110 either passes the data through (unaltered) to its output terminal, or inverts the polarity of the data and then asserts the inverted data at its output terminal, depending on the outcome of the above-described comparison (the comparison performed before the DMA address was set back by 32 bytes). The encoded data asserted at the output terminal of ALU 110 is received by flash interface unit 114, and then written to a set of erased cells of flash memory array 216 (in a well known manner). In preferred implementations, multiple streams of the bits are written to array 216 in parallel, so that at any one time, bits are being written to two or more cells of array 216. For example, in a preferred implementation, two hundred fifty six (256) streams of bits are written to array 216 in parallel (so that a packet of 32 eight-bit bytes of encoded data is written to array 216 during a single write operation). Alternatively, eight streams of bits can be written to array 216 in parallel (so that a packet of 32 eight-bit bytes of encoded data is written to array 216 by a sequence of thirty-two writes, with eight encoded bits written during each write).

Preferably, control engine 130 is capable of monitoring the contents of shift register 118 and shifting the contents of register 118 by sequencer control to enable evaluation of any selected packet of encoded data (e.g., to enable the output from register 118 of a polarity bit, or other encoding tag bit, for any selected packet of encoded data). Shift register 118 should be circular in nature so as not to lose its contents after a shift.

Also preferably, control engine 130 can alter the length of each DMA transfer to fit the desired volume of data to be written to array 216 (i.e., the size of each packet asserted from buffer memory 104 is preferably controllable). Preferably, control engine 130 can alter the DMA address to allow several passes of operation on each packet of data accessed by a DMA operation.

Also preferably, ALU 110 can assert to control engine 130 a special ALU status bit (which is cleared by controller 129 and is polarity selectable) to allow checking as to whether a packet (or other field of bits) consisting entirely of "1" (or "0") bits is being transferred into or out from ALU 110.

Where each erased cell of array 216 is indicative of the logical value "1," significant power must be consumed to program such an erased cell only where a bit indicative of the logical value "0" is to be written thereto. Where ALU 110 has generated a packet of encoded data by inverting a packet of raw data from memory 104, the encoded data will comprise more encoded bits indicative of the value "1" than encoded bits indicative of the value "0," and thus less power will be consumed to write the encoded packet than would have been required to write the corresponding raw bits of the packet directly from memory 104 (through interface 114) to flash array 216 without first inverting the raw bits in accordance with the invention.

After a packet of encoded bits is written to flash memory array 216, the sequencer (within control engine 130) resets accumulator register 112 to zero, sends a control signal to DMA unit 120 to set the DMA address to the next packet of the sector stored in memory 104), sets ALU 110 to a mode of operation in which it adds the data value asserted to its "A" input to the data value asserted to its "B" input and asserts the sum to accumulator register 112, enables converter 108, and sets DMA 120 to a mode in which it sequentially asserts the 8-bit bytes of the next packet from memory 104 to converter 108, and sets multiplexer 106 to a mode in which it passes the data it receives from converter 108 to ALU 110. The entire process of counting the number of bits of raw data of the packet which are indicative of the value "1," comparing the result to a value indicative of half the number of bits of the packet, encoding the packet, and writing the encoded packet to array 216 is performed on the next packet (in the above-described manner in which it was performed on the previous packet).

The procedure of "encoding" the packets to be written to flash memory array 216 (determining the number the number of bits of raw data of each packet which are indicative of a particular logical value such as "1," comparing the result to a value indicative of half the number of bits of the packet, and encoding the packet depending on the result of the comparison) is preferably done in an overlapped manner (after the first packet has been converted), in the following sense. The first packet is encoded, the encoded first packet is sent to flash memory array 216 for programming, and programming is started on the encoded first packet. Because programming is an activity which requires a relatively long time to perform, control engine 130 causes the second packet to be encoded while the flash array is being programmed with the encoded first packet, so that the encoded second packet will be ready for programming when the encoded first packet has been programmed. This process repeats, so that the third packet is encoded while the encoded second packet is programmed, and so on. Processing a sequence of packets in this "overlapped" manner minimizes the time required for encoding and programming the packets (and eliminates the need for extra time for encoding all of the packets, other than the first packet).

After all packets of raw data stored in memory 104 have been so processed (i.e., after all packets of encoded bits corresponding to the packets of raw data have been written to array 216), the sequencer within control engine 130 selects shift register 118 as the data source. At this point, shift register 118 contains polarity bits indicative of the encoding operation (either polarity inversion or no polarity inversion) performed on all the packets of the data in memory 104. These polarity bits are sequentially asserted (as a sequence of eight-bit words) from shift register 118 through multiplexer 106 and ALU 110 to flash interface 114, and are then written to cells of array 216. In the above-mentioned implementation of array 216 in which each row of array 216 consists of 4352 cells (and can store sixteen 256-bit packets of data plus an additional 256-bit packet of "overhead" bits), all the packets of encoded data (corresponding to 4096 bits of raw data stored in buffer 104) have been written to a single row of array 216, and the polarity bits from register 118 are also written to the same row of array 216 (as part of a packet of 256 "overhead" bits). Preferably, there is a single (binary) polarity bit for each of the sixteen packets of encoded data, so that a total of sixteen polarity bits are written from register 118 to array 216 for each sector of encoded data. Thus, there is room for additional overhead bits (such as error correction code or "ECC" bits) to be written to the same 256-bit packet of overhead bits to which the polarity bits are written. Preferably, controller 129 generates ECC check bits (and defect bits and system flags) for the packet of data just sent to array 216, and causes these ECC check bits (and defect bits and system flags) to be written to the same 256-bit packet of overhead bits to which the polarity bits are written.

To summarize, the polarity bits stored in array 216 (with each sector of encoded data bits) determine the type of encoding (inversion or no inversion) performed on each packet of the stored sector of encoded data bits. For example, a polarity bit indicating the binary value "0" for a packet can indicate that the packet has undergone polarity inversion and a polarity bit indicating the binary value "1" for the packet can indicate that the packet has not undergone polarity inversion. In other embodiments of the invention in which encoding operations other than "polarity inversion" or "no polarity inversion" are performed on the packets, a set of one or more encoding tag bits (other than polarity bits) is generated for each packet of encoded bits (and preferably stored in the same flash memory sector as is the packet), with each such set determining the type of encoding performed on the corresponding packet. Each such stored set of encoding tag bits will be read from the flash memory with (or shortly before) the packet to determine the type of decoding required for the packet.

To read a sector of encoded data from array 216, the FIG. 3 system operates as follows. The sequencer within control engine 130 causes flash interface 114 to read the polarity bits for the sector from array 216. The polarity bits that are read are asserted through ALU 110 to shift register 118. Preferably also, additional overhead bits (e.g., error correction code bits) stored with the polarity bits are also read from array 216, and stored in a buffer (not shown) within chip 3 (or in register 118) or processed in circuit 132 to be discussed below.

Control engine 130 then tests the polarity of the first polarity bit in shift register 118 to determine the encoding of the first packet of encoded bits (of the sector) stored in array 216, and the control engine then sets the polarity of ALU 110 to match that of the first packet (in the sense that the control engine sets ALU 110 to a mode in which ALU 110 inverts, or passes through without inverting, the next packet of bits it receives). The sequencer within control engine 130 then sets the DMA address to the start of the sector, and causes DMA unit 120 and flash interface 114 to execute a DMA operation in which the first packet of encoded bits (e.g., the first 32 eight-bit bytes of encoded bits) are read from array 216, asserted from interface 114 to ALU 110, inverted (or not inverted) in ALU 110 depending on the value of the corresponding polarity bit in shift register 118, and written from the output of ALU 110 to buffer memory 104. The sequencer monitors the DMA operation for completion of the packet transfer to memory 104.

Upon completion of the packet transfer, control engine 130 tests the polarity of the next polarity bit in shift register 118 to determine the encoding of the next packet of encoded bits stored in array 216, and the control engine then sets the polarity of ALU 110 to match that of the next packet of encoded bits. Another DMA operation is performed to read the next packet from array 216, decode the next packet in ALU 110, and write the decoded packet to buffer memory 104.

This sequence of steps is repeated for each packet of the sector to be read from array 216, until all packets of the sector have been read from array 216, decoded, and written to buffer memory 104. At this point, the error correction code for the sector is reread from array 216 (the error correction code bits, although a subset of the described overhead bits, are not stored in a buffer within chip 3 as are others of the overhead bits). The error correction code is preferably checked (e.g., by below-described circuit 132) under control of control engine 130 to determine if there is any detectible error in the data in buffer memory 104. If no error is detected, the data are transferred from buffer memory 104 through host interface 102 to a host processor.

Having described a preferred embodiment of the invention (and several variations thereon) with reference to FIGS. 3 and 4, we next describe several aspects of the invention common to the above-described embodiment and other embodiments of the invention.

In general terms, the inventive method reduces the number of bits being programmed to a flash memory array at a given time (by encoding raw bits to be written to the flash memory, and then writing the encoded bits, so that fewer of the encoded bits are programmed than would be programmed if the raw bits were written without being encoded), while also achieving high speeds in writing the bits to the flash memory. If one considers the value of each set of bits to be written (e.g., the hexadecimal number indicated by the bits when the bits are considered together as concatenated digits), the power required to write the set to a flash memory depends on the value of the set, and on the number of bits in the set of each particular logical level (e.g., the number of bits indicating "one" or "zero" where the bits are binary bits). Whether the flash memory is implemented with each cell storing a binary bit, or a bit other than a binary bit (e.g., a bit having one of four possible values), the amount of power required to program each cell depends on the logical value to which the cell is to be programmed. The invention is based on a recognition that counting the ones or zeroes in a set of binary data bits to be written to erased cells of a flash memory, and inverting the raw data according to a polarity that reduces the number of cells going from the erased state to the programmed state would produce results that would reduce the number of bits being programmed at one time.

The inventive method includes the steps of counting the number of bits in a set (of raw data bits to be written to erased cells of a flash memory array) which have a particular logical value or values (e.g., the value for which the most power is required to program the bit to a flash memory cell), and encoding the raw data according to a scheme that reduces (and preferably minimizes) the number of cells of the array going from the erased state to a programmed state (or to those programmed states requiring the most power to program). The inventive method gives the desired effect of enabling the programming of as many bits as possible for a given power design while also speeding the programming by statistical reduction of the number of bits trying to go from the erased state to the programmed state.

In examples of the inventive method to be described below, each set of bits to be written to a flash memory consists of sixteen binary bits. However, sets of bits having any other size can be processed by other embodiments of the invention.

Consider the following set of sixteen binary data bits (having the value "12bc hex") to be written to a set of sixteen erased flash memory cells:

0001 0010 1011 1100.

In this set of bits, the step of counting the number of "0" bits or "1" bits determines that there are nine "0" bits and seven "1" bits, and thus determines that writing the bits (without inverting them) would require programming of more cells than leaving cells in the erased state (assuming each erased cell indicates a logical "1"). By inverting the set of bits (in the sense of replacing it by the following set of inverted bits: 1110 1101 0100 0011), and programming the cells with the inverted bits, the number of cells that must be programmed is reduced, and thus the power required to program the cells is reduced. This reduces the demand on the charge pump circuitry of the flash memory system, and reduces the expected time (i.e., the statistically expected delay) required to store the data in the flash memory cells. The inverted data has the value "ed43 hex," but this value together with a single binary "tag" bit indicating that the data have been inverted, fully determine the original value ("12bc hex") of the raw (non-inverted) bits.

With this approach to encoding raw data and then writing the encoded data in erased cells of a flash memory system (optionally with a tag bit or tag bits determining the encoding scheme), the invention guarantees that each set of X bits can be written by programming a maximum of X/2 cells (plus any cells needed to program the tag bit or bits). This effectively reduces the programming load by a substantial amount. We will see 50% to 100% reduction in the number of bits (cells) being programmed for a given set (packet) of raw bits that are inverted and then written. The net effect will be increased programming speed and power reduction per bit stored in flash memory.

A 100% reduction in programming of cells is seen when a field of consisting entirely of raw bits indicative of "0" is encoded (inverted) and then stored in flash memory cells. In this case, the controller of the flash system stores the data in the inverted state (consisting entirely of "1" bits), so no cell programming is required.

When storing encoded data in this manner in a flash memory, the encoding scheme used to encode the stored data must also be identified (by data stored in the flash memory) in a manner that will allow the stored data to be decoded (e.g., inverted or not inverted) when read back from the flash memory.

To read packets of encoded bits (and any corresponding overhead bits, including bits identifying the encoding scheme for each packet) from a sector of the flash memory, the controller of the flash memory system locates the sector where the data is stored and reads the overhead bits (typically stored as a packet of bits distinct from the stored packets of encoded data bits). The controller stores and/or processes the overhead bits, including by conditioning the data path to decode (e.g., invert or not invert) the first packet of incoming data from the flash memory array. The first packet of data is then DMA gated from the flash memory array, decoded, and written into an internal data buffer. The controller then conditions the data path (as a result of processing at least some of the overhead bits) to decode the next packet of incoming data from the flash memory array, the next packet of data is then DMA gated from the flash memory array, decoded, and written into the internal data buffer, and this process repeats until all packets of the encoded data have been decoded and written to the internal data buffer. After all the decoded data has been stored in the internal data buffer, the controller preferably performs error detection (using the ECC check bits read from the flash memory array), and if the data is found correct the controller causes the data to be sent from the internal data buffer to a host over a controller interface. Reads of different sectors of the flash memory proceed with this same procedure until all desired sectors have been sent to the host. When all sectors are sent to the host, the read operation is complete.

With reference again to FIG. 3, circuit 3 preferably includes multiplexer circuit 230 and error detection and correction circuit 132 (ECC 132) connected as shown (with the input of ECC 132 connected to the output of multiplexer 230). When circuit 3 operates in a write mode in which it encodes and writes data to array 216, multiplexers 106 and 230 assert to ECC 132 the raw data output from buffer memory 104. In this mode, ECC 132 processes the raw data (preferably an entire sector of the raw data) to calculate check bits (before the raw data is encoded in ALU 110). The check bits are then asserted by ECC 132 to flash interface 114, and flash interface 114 causes the check bits to be written to flash memory array 216 (e.g., one set of check bits for each packet or sector of data that is written to array 216).

When circuit 3 operates in a read mode in which it reads data from array 216 and decodes this data, ALU 110 asserts the decoded data (and the check bits which have been read from array 216 for said decoded data) through multiplexer 230 to ECC 132. In this mode, ECC 132 processes the check bits and decoded data to identify errors in the decoded data, and ECC 132 asserts appropriate control signals to control engine 130 as a result of this operation. ECC 132 thus performs error detection on raw data (data which has been read from array 216, and decoded to return it to its original "raw" state), and this error detection is a secondary check that packets have been encoded and decoded properly (since a packet that has been decoded with the wrong polarity will be detected by the error detection operation).

A flash memory system which embodies the invention can program more bits for a given charge pump size than one which does not embody the invention. A flash memory system which embodies the invention can program the same number of bits using a charge pump of smaller size than can a flash memory system which does not embody the invention. A flash memory system which embodies the invention can program bits more rapidly than can a flash memory system which does not embody the invention, since the invention alters the data pattern to be programmed in a manner that reduces the probability that slow bits will extend the program time.

Preferred embodiments of the invention can detect a packet which consists entirely of ones (to be written to erased cells of a flash memory array), and can skip the unnecessary operation of writing such packet to the erased cells (preferably, by reporting that the packet has been written without actually writing it, or by storing data indicating that the packet has been written without actually writing it). Preferred embodiments of the invention can detect a packet which consists entirely of zeros (to be written to erased cells of a flash memory array), and can skip the unnecessary operation of writing such packet to the erased cells (preferably, by reporting that the packet has been inverted and then written without actually writing the packet, or by storing data indicating that the packet has been inverted and then written without actually writing the packet.

Preferred embodiments of a flash memory system (or other non-volatile memory system) in accordance with the invention can encode write groups to reduce the number of bits that must be programmed to cells of a memory array of the system in order to write the groups to the array. This reduced programming, based on the data group (or field) to be written to the array of cells, reduces the overall number of bits that must be programmed within the array (or within a sector of the array). This in turn will reduce the program stress on the memory system (and the array of cells thereof) and will add to the reliability of the memory system.

Preferred embodiments of the inventive conversion circuit receive a field of data, and process such data to output a binary count for the number of bits of such field which are indicative of the value "0" (and/or the value "1"). Other preferred embodiments of the inventive conversion circuit (which determine the number of bits of each packet or field of data which have a particular value, and optionally also encode the packet or field in response to such determination) operate in response to an enable/disable signal, and in preferred embodiments of a flash memory system (or other non-volatile memory system) which includes the inventive conversion circuit, the conversion circuit is inactive (i.e., in a mode which consumes little or no power) unless enabled by an enable signal (e.g., an enable signal from control engine 130). This latter feature reduces power consumption by the system when the conversion operation (including the encoding operation) is not to be performed.

Preferred embodiments of the invention have been described with reference to FIGS. 3, 4, 4A, 5, 6, and 7. Although these embodiments have been described in some detail, it is contemplated that changes from these embodiments can be made without departing from the spirit and scope of the invention as defined by the appended claims.

For example, alternative embodiments of the invention generate a count signal for each packet of bits to be written to erased cells of an array (where the count signal indicates the number of bits in the packet having a particular value), and each packet is encoded in a manner (other than by simple polarity inversion of all bits of the packet) determined by the corresponding count signal to reduce the power needed to write the encoded bits to the erased cells. For example, the encoding operation can consist of polarity inversion of some but not all of the bits of each packet to be encoded.

What is claimed is:

1. A method for encoding binary bits for writing to a non-volatile memory device, said method comprising the steps of:

selecting a plurality of packets of the bits, each of the packets comprising X binary bits;

determining the number of bits of said X binary bits in each of the packets which have a first value and the number of bits of said X binary bits in said each of the packets which have a second value, by accumulating data indicative of the number of bits in each of a number of subsets of said each of the packets which have the first value; and for each of the packets, encoding said X binary bits to a first set of values when the number of bits of said first value exceeds the number of bits of said second value, and encoding said X binary bits to a second set of values when the number of bits of said second value exceeds the number of bits of said first value.

2. A method of programming a non-volatile memory device, comprising the steps of:

providing a plurality of packets of bits, each of said packets comprising X number of binary bits;

for each of the packets, determining the number of binary bits representative of a first value and the number of binary bits representative of a second value, by accumulating data indicative of the number of binary bits in each of a number of subsets of said each of the packets which are representative of the first value; and for each of the packets, selecting an encoding state from at least two possible encoding states, said encoding state selected to require less power for programming, said encoding state selected in reference to the determined number of binary bits in said each of the packets which are representative of the first value and the second value; and programming at least a portion of said non-volatile memory device in accordance with said selected encoding state for said each of the packets.

3. A method for encoding binary bits to be written to erased cells of an array of flash memory cells, said method including the steps of:

(a) processing X-bit packets of the bits to generate count signals, wherein a count signal is generated for each of the packets by accumulating data indicative of the number of bits which have a first value in each of a number of subsets of said each of the packets, each said count signal is indicative of how many bits of the corresponding one of the packets have the first value, and X is an integer; and (b) encoding the packets to generate X-bit encoded packets of encoded binary bits, by performing a first encoding operation on each of the packets whose count signal satisfies a first criterion and a second encoding operation on each of the packets whose count signal satisfies a second criterion but does not satisfy the first criterion, so that each of the encoded packets consists of P encoded bits having the first value and Q encoded bits having a second value, where P and Q are integers satisfying X=P+Q, and P is not less than Q.

4. The method of claim 3, also including the step of:

(c) writing the encoded packets to a first subset of the erased cells of the array.

5. The method of claim 4, wherein less power is consumed during step (c) to write a binary bit having the first value to each of the erased cells than to write a binary bit having the second value to said each of the erased cells.

6. The method of claim 4, also including the steps of:

(d) generating polarity flag bits for the encoded packets, wherein the polarity flag bits includes a set of at least one polarity flag bit for each of the encoded packets, and each said set is indicative of which of the first encoding operation and the second encoding operation was performed to generate said each of the encoded packets; and (e) writing the polarity flag bits to a second subset of the erased cells of the array.

7. The method of claim 6, wherein step (e) includes the steps of:

collecting the polarity flag bits in a shift register, where the shift register contains a bit for each of the encoded packets; and writing the polarity flag bits from the shift register to said second subset of the erased cells of the array.

8. The method of claim 6, also including the steps of:

(f) reading the polarity flag bits and the encoded packets from the array;

(g) temporarily storing the polarity flag bits; and (h) performing an inverse of the first encoding operation on each of the encoded packets read during step (f) for which one of the polarity flag bits stored during step (g) indicates that the first encoding operation was performed to generate said each of the encoded packets read during step (f).

9. A method for encoding binary bits to be written to erased cells of an array of flash memory cells, said method including the steps of:

(a) storing a number of X-bit packets of the bits in a buffer memory, where X is an integer;

(b) reading each of the packets from the buffer memory and generating a packet count signal from data indicative of the number of bits which have a first one of a first value and a second value in each of at least two subsets of said each of the packets, said packet count signal being indicative of how many bits of said each of the packets have said first one of the first value and the second value;

(c) comparing each said packet count signal to a reference value, to determine each of the packets whose packet count signal is greater than the reference value and to determine each of the packets whose packet count signal is not greater than the reference value;

(d) performing a first encoding operation on each of the packets whose packet count signal is greater than the reference value to generate an X-bit encoded packet of encoded binary bits for said each of the packets; and (e) performing a second encoding operation on each of the packets whose packet count signal is not greater than the reference value to generate an X-bit encoded packet of encoded binary bits for said each of the packets, whereby steps (d) and (e) together accomplish generation of a set of encoded packets.

10. The method of claim 9, wherein step (b) includes the steps of:

reading a sequence of the subsets of said each of the packets from the buffer memory and generating count signals therefrom, said count signals including a count signal for each of the subsets indicative of how many bits of said each of the subsets have said first one of said first value and a second value;

adding the count signals for said each of the packets to generate said packet count signal for said each of the packets.

11. The method of claim 9, wherein each of the packets whose packet count signal is not greater than the reference value consists of more bits having a second value than bits having the first value, and wherein each of the encoded packets generated during step (e) consists of more bits having the first value than bits having the second value.

12. The method of claim 9, wherein the second encoding operation consists of inverting each of the bits of said each of the packets whose packet count signal is not greater than the reference value.

13. The method of claim 9, also including the step of:

(f) writing the encoded packets to a first subset of the erased cells of the array.

14. The method of claim 13, wherein less power is consumed during step (f) to write a binary bit having the first value to each of the erased cells than to write a binary bit having a second value to said each of the erased cells.

15. The method of claim 13, wherein step (f) includes the steps of:

generating polarity flag bits for the encoded packets, wherein the polarity flag bits includes a set of at least one polarity flag bit for each of the encoded packets, and each said set of at least one polarity flag bit is indicative of which of the first encoding operation and the second encoding operation was performed to generate said each of the encoded packets; and writing the polarity flag bits to a second subset of the erased cells of the array.

16. The method of claim 13, wherein step (f) includes the steps of:

writing a first one of the encoded packets to cells of the first subset array while performing at least steps (b) and (c) on a second one of the encoded packets.

17. A method for encoding binary bits to be written to erased cells of an array of flash memory cells, wherein each of the flash memory cells is capable of storing a binary bit, said method including the steps of:
(a) generating count signals from packets of the bits, wherein the count signals include a count signal for each of the packets indicative of how many bits of each of the packets have a selected binary value, and wherein the count signal for each of the packets is generated from data indicative of the number of bits in each of at least two subsets of each of the packets which have said selected binary value; and
(b) performing an encoding operation on each of the packets to generate an encoded packet of binary bits for each of the packets, wherein each said encoding operation is determined by the count signal for each of the packets.

18. The method of claim 17, also including the step of:
writing the encoded packets to a first subset of the erased cells of the array.

19. A method for controlling a flash memory system, wherein the system includes an array of flash memory cells and circuitry which erases selected blocks of the cells and writes packets of binary bits to erased ones of the cells, wherein the system consumes less power to write a binary bit having a first value to an erased one of the cells than to write a binary bit having a second value to said erased one of the cells, said method including the steps of:
(a) determining how many of the bits in each of the packets of bits have a first one of said first value and said second value by generating data indicative of the number of bits in each of at least two subsets of said each of the packets which have said first one of the first value and the second value, and generating count data indicative of said determination; and
(b) generating an encoded packet of binary bits from each of the packets, wherein each said encoded packet has a selected one of two polarities based on the count data indicative of the determination of how many of the bits in each of the packets have the first one of said first value and said second value.

20. The method of claim 19, wherein step (a) includes the steps of:
generating count signals from a sequence of the subsets of each of the packets, said count signals including a count signal for each of the subsets indicative of how many bits of each of the subsets have said first one of said first value and said second value; and
generating from the count signals for each one of the packets a packet count signal indicative of how many bits of said one of the packets of bits have said first one of said first value and said second value.

21. The method of claim 19, wherein step (b) includes the steps of:
comparing the packet count signal for each of the packets to a reference value;
generating a status signal as a result of each such comparison; and
generating the encoded packet for each of the packets in response to the status signal.

22. The method of claim 19, also including the steps of:
(c) generating a polarity bit for each said encoded packet, said polarity bit being indicative of the selected one of the two polarities for said encoded packet;

(d) storing each said polarity bit in a shift register; and
(e) writing each said encoded packet, and each said polarity bit, to erased ones of the cells.

23. The method for claim 19, wherein step (b) includes the steps of:
inverting each of the packets in response to the count data for each of the packets indicating a determination that each of the packets includes more bits having the second value than bits having the first value.

24. A memory system, including:
an array of flash memory cells, wherein the system consumes less power to write a binary bit having a first value to an erased one of said cells than to write a binary bit having a second value to said erased one of the cells; and
encoding circuitry coupled to receive X-bit packets of binary bits and configured to generate X-bit packets of encoded binary bits from the X-bit packets of binary bits, such that each of the packets of encoded binary bits consists of P encoded binary bits having the first value and Q encoded binary bits having the second value, where X, P, and Q are integers satisfying X=P+Q, and P is not less than Q, wherein the encoding circuitry includes:
count generation circuitry coupled to receive the packets and configured to generate count signals, wherein a count signal is generated for each of the packets by accumulating data indicative of the number of bits which have a first one of the first value and the second value in each of a number of subsets of each of the packets, and each said count signal is indicative of how many bits of the corresponding one of the packets have a first one of the first value and the second value;
a processor coupled to receive the count signals and configured to generate a first control signal for each of the count signals which satisfies a first criterion and a second control signal for each of the count signals which satisfies a second criterion; and
packet encoding circuitry coupled to receive each said first control signal and each said second control signal and configured to encode the packets in response to each said first control signal and each said second control signal, wherein the packet encoding circuitry performs a first encoding operation on each of the packets represented by said first control signal and a second encoding operation on each of the packets represented by said second control signal.

25. The system of claim 24, also including:
interface circuitry which writes the X-bit packets of encoded binary bits to erased flash memory cells of the array.

26. The system of claim 25, wherein the interface circuitry also includes circuitry which reads packets of encoded binary bits from the array, and wherein the system also includes:
decoding circuitry which decodes each of the packets of encoded binary bits read from the array.

27. The system of claim 25, also including:
a control engine which is configured to assert a selected one of an enable signal and a disable signal to the encoding circuitry, and wherein the encoding circuitry operates in an active mode which consumes power in response to the enable signal and in an inactive mode which consumes less power in response to the disable signal.

28. A memory system, including:
an array of flash memory cells, wherein the system consumes less power to write a bit having a first value to an erased one of said cells than to write a bit having a second value to said erased one of the cells;
a buffer memory which stores a number of X-bit packets of binary bits, where X is an integer;
a control engine which asserts a sequence of control signals in response to a command and a sequence of status signals, wherein the control engine is configured to generate a first one of the control signals in response to a first one of the status signals;
a conversion circuit connected to the buffer memory which receives a sequence of subsets of each of the packets and generates a count signal for each of the subsets indicative of how many binary bits of said each of the subsets have a first one of said first value and said second value; and
logic circuitry which operates in a first mode in response to a second one of the control signals in which it receives each said count signal for one of the packets and generates therefrom a packet count signal indicative of how many binary bits of said one of the packets have said first one of said first value and said second value, wherein the logic circuitry operates in a second mode in response to a third one of the control signals in which it compares the packet count signal to a reference value, generates said first one of the status signals as a result of the comparison, and asserts said first one of the status signals to the control engine, and wherein the logic circuitry operates in a third mode in response to the first one of the control signals in which it performs a first encoding operation on said one of the packets thereby generating an X-bit packet of encoded binary bits.

29. The system of claim 28, wherein the first one of the control signals indicates that said one of the packets consists of more binary bits having the second value than binary bits having the first value, and wherein said packet of encoded binary bits consists of more binary bits having the first value than binary bits having the second value.

30. The system of claim 28, wherein the first one of the status signals indicates that the packet count signal has a value that does not exceed the reference value, and
wherein said first encoding operation is the identity operation, so that said X-bit packet of encoded binary bits is identical to said one of the packets of binary bits.

31. The system of claim 28, also including:
a storage unit connected to the control engine, wherein the control engine generates first code data, and stores the first code data in the storage unit, in response to determining that the first one of the status signals indicates that the packet count signal has a value exceeding the reference value, and
wherein the control engine generates second code data, and stores the second code data in the storage unit, in response to determining that the first one of the status signals indicates that the packet count signal has a value that does not exceed the reference value.

32. The system of claim 28, wherein the first encoding operation consists of inverting each of the binary bits of one of the packets.

33. The system of claim 32, wherein each of the flash memory cells is a floating-gate N-channel transistor which stores a binary bit and is indicative of said first value when erased, and wherein said packet of encoded binary bits consists of more binary bits having the first value than binary bits having the second value.

34. The system of claim 33, wherein the first encoding operation consists of inverting each of the binary bits of one of the packets.

35. The system of claim 28, also including:
interface circuitry connected to the logic circuitry and to the control engine, wherein the interface circuitry writes the packet of encoded binary bits to erased flash memory cells of the array in response to receiving said packet of encoded binary bits from the logic circuitry and at least one of the control signals from the control engine.

36. A memory system, including:
an array of flash memory cells, each of the cells being capable of storing a binary bit;
count generation circuitry which receives packets of binary bits and generates count signals therefrom, wherein the count generation circuitry generates for each of said packets a count signal indicative of how many binary bits of said each of the packets have a selected value by accumulating data indicative of the number of bits which have the selected value in each of a number of subsets of said each of the packets;
encoding circuitry which receives each of the packets of binary bits and performs an encoding operation on said each of the packets of binary bits to generate a packet of encoded binary bits, wherein the encoding operation is determined by the count signal for said each of the packets of binary bits;
a control engine which asserts a sequence of control signals in response to a command; and
interface circuitry, connected to the array and the encoding circuitry, which writes each said packet of encoded binary bits to erased flash memory cells of the array in response to at least one of the control signals from the control engine.

37. The system of claim 36, also including:
an error detection and correction circuit coupled to receive the packets of binary bits and configured to operate in a first mode in which it generates check bits in response to the packets of binary bits and asserts the check bits to the interface circuitry, and wherein the interface circuitry writes the check bits to the array in response to at least one of the control signals from the control engine.

38. The system of claim 37, wherein the interface circuitry also includes circuitry which reads packets of encoded binary bits from the array, and wherein the system also includes:
decoding circuitry which decodes each of the packets of encoded binary bits read from the array, and wherein the error detection and correction circuit is coupled to receive packets of decoded bits that have been generated by the decoding circuitry, and is configured to operate in a second mode in which said error detection and correction circuit processes check bits of the packets of decoded bits to perform error detection and correction on said packets of decoded bits.

39. A controller for a flash memory system, wherein the system includes an array of flash memory cells and circuitry configured to erase selected blocks of the cells and to write packets of bits to erased ones of the cells, wherein the system consumes less power to write a bit having a first value to an erased one of the cells than to write a bit having a second value to said erased one of the cells, said controller including:

a first circuit coupled to receive the packets of bits and configured to determine how many of the bits in each of said packets of bits have a first one of the first value and the second value by accumulating data indicative of the number of bits which have the first one of the first value and the second value in each of a number of subsets of said each of the packets, and to generate count data indicative of said determination; and a second circuit coupled to receive the packets of bits and configured to generate a packet of encoded bits from each of said packets of bits, wherein each said packet of encoded bits has a selected one of two polarities based on the count data indicative of the determination of how many of the bits in said each of the packets of bits have the first one of said first value and said second value.

40. The controller of claim 39, wherein the first circuit includes:

a conversion circuit coupled to receive a sequence of the subsets of said each of the packets of bits and configured to generate count signals therefrom, said count signals including a count signal for each of the subsets indicative of how many bits of said each of the subsets have said first one of said first value and said second value; and logic circuitry configured to operate in a first mode in which it receives the count signals for one of the packets of bits and generates therefrom a packet count signal indicative of how many bits of said one of the packets of bits have said first one of said first value and said second value.

41. The controller of claim 40, wherein the logic circuitry is also configured to operate in a second mode in which it compares the packet count signal to a reference value and generates a status signal as a result of the comparison, wherein the second circuit generates the packet of encoded bits from said one of the packets of bits in response to the status signal.

42. The controller of claim 41, also including:

a third circuit coupled to receive each said packet of encoded bits and configured to generate a polarity bit for each said packet of encoded bits, said polarity bit being indicative of the selected one of the two polarities for said packet of encoded bits; and a register for storing each said polarity bit while the system writes the packets of encoded bits to the erased ones of the cells.

43. The controller of claim 42, also including a fourth circuit coupled to the array and configured to read polarity bits from the array and store said polarity bits in the register.

44. The controller of claim 39, wherein the second circuit includes:

logic circuitry which operates in a mode in which it inverts each of the packets of bits in response to the count data for said each of the packets of bits indicating a determination that said each of the packets of bits includes more bits having the second value than bits having the first value.

45. A count generation circuit for use in a flash memory system, wherein the system includes an array of flash memory cells and circuitry configured to erase selected blocks of the cells and write packets of bits to erased ones of the cells, wherein the system consumes less power to write a bit having a first value to an erased one of the cells than to write a bit having a second value to said erased one of the cells, said count generation circuit including:

a converter circuit configured to operate in a first mode in which it receives a sequence of subsets of bits of the packets and asserts count data in response to each of the subsets, wherein the count data for said each of the subsets is indicative of how many of the bits in said each of the subsets have a first one of said first value and said second value; and a count circuit which processes the count data for all the subsets of one of the packets, thereby generating packet count data indicative of how many of the bits in said one of the packets have said first one of said first value and said second value.

46. The count generation circuit of claim 45, wherein the count circuit includes:

an adder having an output, a first input, and a second input, wherein the first input receives the count data from the converter circuit; and an accumulator register having an input connected to the output of the adder, and an output connected to the second input of the adder.

47. The count generation circuit of claim 45, also including:

control circuitry which controls the adder to cause said adder to add each said count data from the converter circuit to data stored in the accumulator register thereby generating sum data, and which controls the adder to cause said adder to assert each said sum data to the accumulator register thereby updating data stored in the accumulator register.

48. The count generation circuit of claim 47, wherein the control circuitry resets the accumulator register after the count circuit has processed the count data for all the subsets of one of the packets.

49. The count generation circuit of claim 45, wherein the converter circuit operates in the first mode only in response to an enable signal from a control circuit.

50. The count generation circuit of claim 45, wherein the converter circuit receives the bits of each of the subsets of bits in parallel, said each of the subsets consists of eight bits of one of the packets, and the count data for said each of the subsets consists of four count bits.

51. The count generation circuit of claim 45, wherein the converter circuit includes:

a first partial count circuit which receives in parallel a set of least significant bits of said each of the subsets, and asserts in response first partial count data;

a second partial count circuit which receives in parallel a set of most significant bits of said each of the subsets, and asserts in response second partial count data; and a multi-bit adder which adds the first partial count data to the second partial count data, thereby generating said count data for said each of the subsets.

52. The count generation circuit of claim 45, wherein the converter circuit is a look-up table memory which outputs said count data for said each of the subsets in response to being addressed by said each of the subsets.

* * * * *